(12) United States Patent
Dutta et al.

(10) Patent No.: US 12,255,381 B2
(45) Date of Patent: Mar. 18, 2025

(54) ANTENNA MODULES EMPLOYING THREE-DIMENSIONAL (3D) BUILD-UP ON MOLD PACKAGE TO SUPPORT EFFICIENT INTEGRATION OF RADIO-FREQUENCY (RF) CIRCUITRY, AND RELATED FABRICATION METHODS

(71) Applicant: QUALCOMM Incorporated, San Diego, CA (US)

(72) Inventors: Ranadeep Dutta, Del Mar, CA (US); Jonghae Kim, San Diego, CA (US); Je-Hsiung Lan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 422 days.

(21) Appl. No.: 17/652,328

(22) Filed: Feb. 24, 2022

(65) Prior Publication Data

US 2023/0268637 A1   Aug. 24, 2023

(51) Int. Cl.
*H01Q 1/22* (2006.01)
*H01L 21/48* (2006.01)
(Continued)

(52) U.S. Cl.
CPC ....... *H01Q 1/2283* (2013.01); *H01L 21/4853* (2013.01); *H01L 21/4857* (2013.01); *H01L 21/565* (2013.01); *H01L 23/3121* (2013.01); *H01L 23/3672* (2013.01); *H01L 23/5383* (2013.01); *H01L 23/5386* (2013.01); *H01L 23/5389* (2013.01); *H01L 23/552* (2013.01); (Continued)

(58) Field of Classification Search
CPC .. H01Q 1/2283; H01L 21/4853; H01L 21/565

USPC ......................................................... 257/701
See application file for complete search history.

(56) References Cited

U.S. PATENT DOCUMENTS

2016/0276308 A1   9/2016   Min et al.
2017/0005023 A1*  1/2017   Chen ....................... H01L 22/14
(Continued)

OTHER PUBLICATIONS

International Search Report and Written Opinion for International Patent Application No. PCT/US2023/060292, mailed May 10, 2023, 17 pages.

*Primary Examiner* — Quoc D Hoang
(74) *Attorney, Agent, or Firm* — W&T/Qualcomm Incorporated

(57) ABSTRACT

Antenna modules employing three-dimensional (3D) build-up on mold package to support efficient integration of radio-frequency (RF) circuitry, and related fabrication methods. The antenna module includes a RF transceiver whose circuitry is split over multiple semiconductor dies ("dies") so different semiconductor devices can be formed in different semiconductor structures. The antenna module is provided as a 3D build-up on mold package to reduce lengths of die-to-die (D2D) interconnections between circuits in different dies. First and second die packages that include respective first and second dies encapsulated in respective first and second mold layers are coupled to each other in a vertical direction in a 3D stacked arrangement with active faces of the first and second dies facing each other to provide a reduced distance between the active faces of the first and second dies. An antenna is stacked on the second die package to provide an antenna(s) for the antenna module.

23 Claims, 12 Drawing Sheets

(51) Int. Cl.
  *H01L 21/56*    (2006.01)
  *H01L 23/00*    (2006.01)
  *H01L 23/31*    (2006.01)
  *H01L 23/367*   (2006.01)
  *H01L 23/538*   (2006.01)
  *H01L 23/552*   (2006.01)
  *H01L 23/66*    (2006.01)
  *H01L 25/00*    (2006.01)
  *H01L 25/10*    (2006.01)

(52) U.S. Cl.
  CPC .............. *H01L 23/66* (2013.01); *H01L 24/19* (2013.01); *H01L 24/20* (2013.01); *H01L 25/105* (2013.01); *H01L 25/50* (2013.01); *H01L 2223/6616* (2013.01); *H01L 2223/6677* (2013.01); *H01L 2224/214* (2013.01); *H01L 2225/1035* (2013.01); *H01L 2225/107* (2013.01); *H01L 2225/1094* (2013.01)

(56) References Cited

U.S. PATENT DOCUMENTS

2018/0323159 A1    11/2018    Kamgaing et al.
2021/0280540 A1    9/2021     Kim et al.

\* cited by examiner

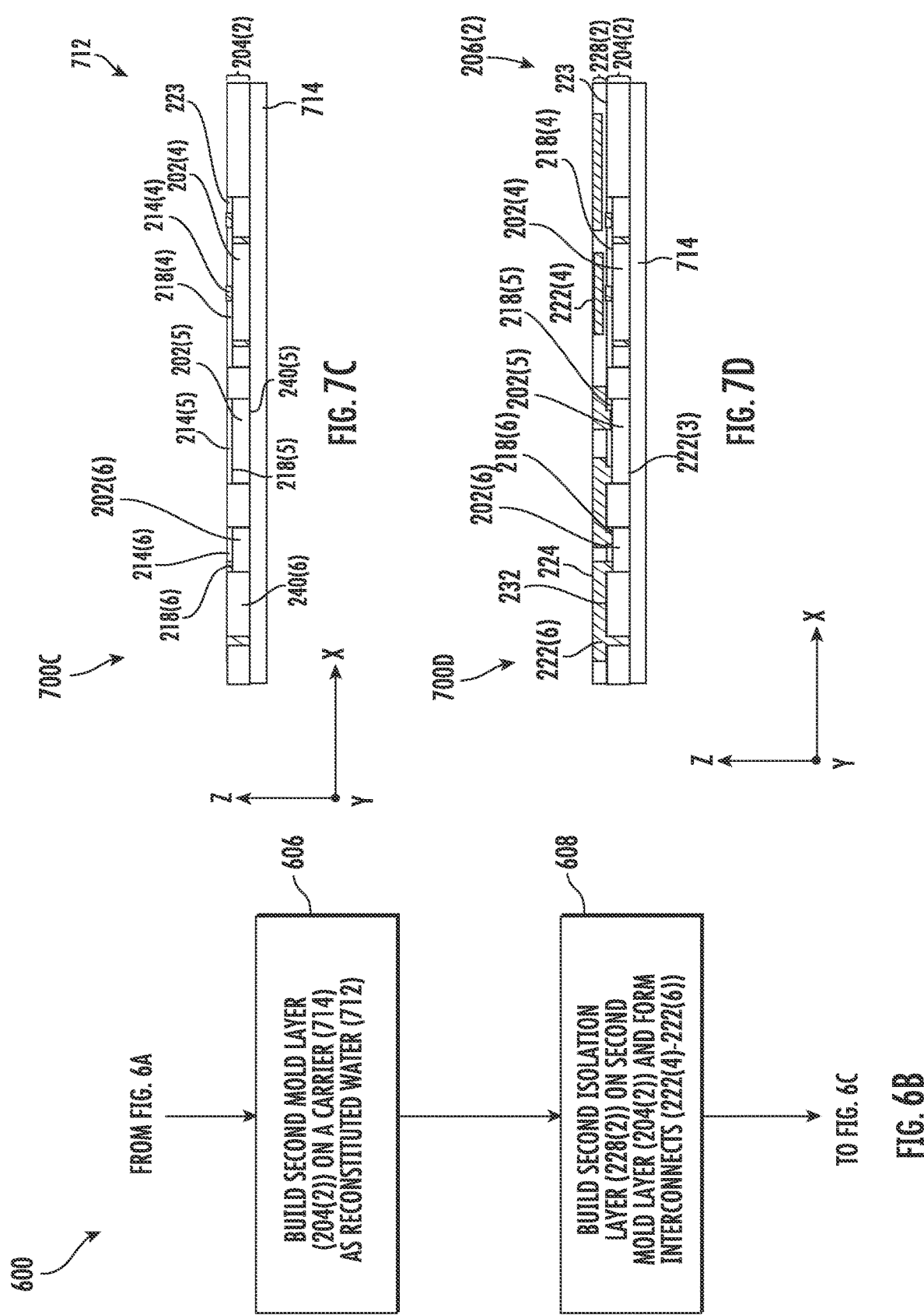

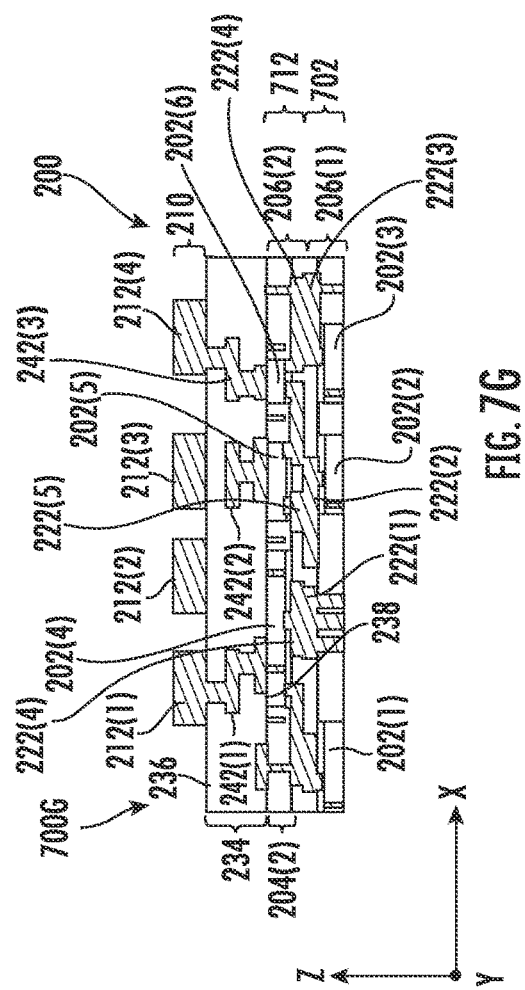
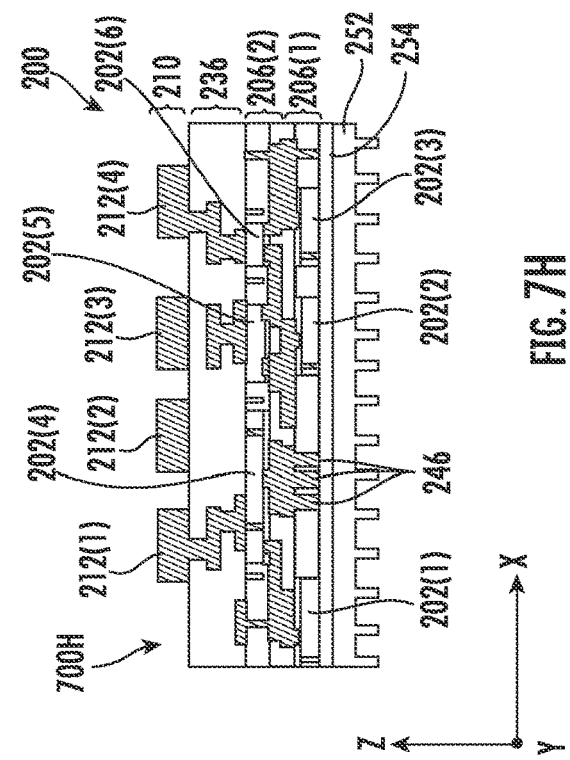
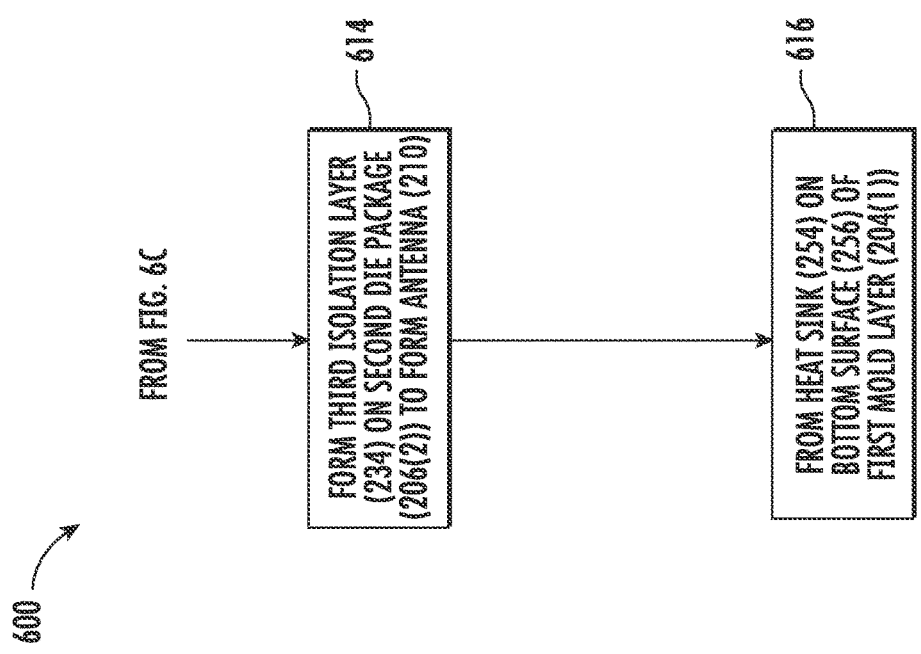

ANTENNA MODULES EMPLOYING THREE-DIMENSIONAL (3D) BUILD-UP ON MOLD PACKAGE TO SUPPORT EFFICIENT INTEGRATION OF RADIO-FREQUENCY (RF) CIRCUITRY, AND RELATED FABRICATION METHODS

BACKGROUND

I. Field of the Disclosure

The field of the disclosure relates to antenna modules (also referred to as "antenna-in-packages" (AiP(s)) that include a radio-frequency (RF) integrated circuit (IC) (RFIC) coupled to an antenna(s) through a package substrate.

II. Background

Modern smart phones and other portable devices have extended the use of different wireless links with a variety of technologies in different radio frequency bands. For example, fifth generation (5G) cellular networks, commonly referred to as 5G new radio (NR), include frequencies in the range of 24.25 to 86 Gigahertz (GHz), with the lower 19.25 GHz (24.25-43.5 GHz) more likely to be used for mobile devices. This frequency spectrum of 5G communications is in the range of millimeter wave (mmWave) or millimeter band. mmWave enables higher data rates than at lower frequencies, such as those used for Wi-Fi and current cellular networks.

Radio-frequency (RF) transceivers that support mmWave spectrum are incorporated into mobile and other portable devices that are designed to support mmWave communications signals. To support the integration of a RF transceiver in a device, the RF transceiver can be integrated in an RF integrated circuit (IC) (RFIC) in a RFIC chip that is provided as part of an antenna module. The RFIC chip is realized in a RFIC semiconductor die ("die"). An antenna module may also be referred to as an "antenna-in-package" (AiP). A conventional antenna module includes a RFIC package that includes one or more RFICs, a power management IC (PMIC), and passive electrical components (e.g., inductors, capacitors, etc.) mounted to a package substrate as a support structure. The RFIC(s) include a RF signal transmitter and receiver capable of modulating RF signals to be transmitted in a supported frequency band(s) and demodulating received RF signals in a supported frequency band(s). The package substrate supports metallization structures to provide chip-to-chip and external signal interfaces to the RFIC package. The package substrate also includes one or more antennas that are electrically coupled to the RFIC package through the metallization structures of the package substrate to be capable of receiving and radiating electrical RF signals as electromagnetic (EM) signals. The package substrate may include a plurality of antennas, also referred to an antenna array, to provide a signal coverage in a desired, larger area around the antenna module.

SUMMARY OF THE DISCLOSURE

Aspects disclosed in the detailed description include antenna modules employing three-dimensional (3D) build-up on mold package to support efficient integration of radio-frequency (RF) circuitry. Related fabrication methods are also disclosed. The antenna module is designed be mounted and coupled to an application circuit board of an electronic device (e.g., a millimeter (mm) Wave communications device) to provide an RF communication capability for the electronic device. In exemplary aspects, the antenna module includes a RF transceiver whose circuitry is split over multiple semiconductor dies ("dies") so different semiconductor devices can be formed in different types of semiconductor structures. For example, it may be desired for performance reasons for certain amplifier circuits of the RF transceiver to be formed in a III-V semiconductor structure, whereas other circuits of the RF transceiver are formed in a IV-VI silicon semiconductor structure. Die-to-die (D2D) interconnections are provided to allow circuits from different dies to be electrically coupled to each other. Thus, it is also desired to minimize the signal routing paths between the multiple dies of the RF transceiver to reduce losses. Thus, in exemplary aspects, 3D stacking of these dies is employed in the antenna module to reduce the lengths of D2D interconnections between circuits in different dies as well as to reduce the mounting area of the antenna module on a circuit board. However, it is also desired to mitigate any increased electro-magnetic interference (EMI) between the dies that may result from the dies being located closer to each other as a resulting to their 3D stacking than would otherwise be the case if such dies were provided in a side-by-side configuration in an antenna module. Heat management and its efficient dissipation may also be more difficult in a 3D stacked antenna module.

Thus, in other exemplary aspects disclosed herein, the antenna module is provided as a 3D build-up on mold package. This reduces the length of the D2D interconnections between dies in different stacked layers in the antenna module to reduce RF transceiver losses and well as provide other exemplary benefits. In this regard, in an exemplary aspect, the antenna module includes a first die package that is a first build-on-mold package. The first die package includes one or more first dies as part of a RF transceiver. For example, the first die package may include a die that includes variable-gain amplifier (VGA) and another die that includes a mixer circuit for the RF transceiver and RF receiver. The first dies are encapsulated by a first mold layer in the first die package. First die interconnects are disposed on and coupled to the active faces of the first dies and are exposed from a top surface of the first mold layer to expose die connections to the first dies. The antenna module also includes a second die package that is a second build-on-mold package. The second die package includes one or more second dies as part of the RF transceiver. For example, the second die package may include a power amplifier for a RF transmitter and a low-noise amplifier (LNA) for the RF receiver. The second dies are encapsulated by a second mold layer of the second die package. Second die interconnects are disposed on and coupled to the active face of the second dies and are exposed from a top surface of the second mold layer to expose die connections to the second dies. The first and second die packages are coupled to each other in a vertical direction in a 3D stacked arrangement, with the active faces of their respective first and second dies facing each other, to provide a reduced distance between the active faces of the first and second dies. This allows for reduced length D2D interconnections between the first and second dies of the first and second die packages to reduce RF transceiver losses. An antenna is coupled to the second die package to provide an antenna(s) for the antenna module.

In another exemplary aspect, the first and second die packages may be formed as part of reconstituted wafers that are then directly bonded to each other to form the D2D interconnections between their respective first and second dies. This can reduce the overall height of the antenna module, as opposed to, for example, the first and second die packages being formed as separate encapsulated packages that are then coupled together through external contacts (e.g., solder balls) and an interposer layer. The reconstituted wafers can be formed with multiple respective first and second die packages stacked on each other, that are then diced to form multiple antenna modules.

The first and second die packages can be bonded together to form a stacked 3D antenna module. The die interconnects of the first and second dies of the respective first and second die packages are electrically coupled together when their die packages are bonded to form D2D interconnections. Because the first and second dies are encapsulated in the respective first and second mold layers of the first and second die packages, a gap area is not present between the first and second die packages that include external interconnects (e.g., solder balls) to couple the first and second die packages together. Also as an example, the first and second die layers may be formed as reconstituted wafers of build-on-mold stacks that are then diced into multiple antenna modules.

Also, by providing the first and second die packages as build-on mold packages that include respective mold layers, this allows for the easier integration of other components when the die packages are built. For example, an EMI shield can be disposed in a mold layer around individual dies, such as by a laser trench etch process. This allows individual dies within a given mold layer of a die package to be specifically shielded in their respective mold layer, with their own dedicated EMI shield. This is opposed to, for example, forming an EMI shield over multiple dies in a die package that may then require the dies to be located farther apart from each other thus increases the surface area of the antenna module.

In yet another exemplary aspect, to provide for flexibility in layout of signal routing paths of D2D interconnections between the first and second dies in the first and second die packages, the first die package also includes a first isolation layer. The first isolation layer is formed adjacent to the first mold layer adjacent to the active faces of the first dies. The first isolation layer provides isolation for the first dies in the first mold layer and also provides a structure in which additional interconnects can be formed that are coupled to the die interconnects of the first dies for signal routing to the first dies. For example, the first isolation layer may include redistribution layers (RDLs) to form interconnects to the die interconnects of the first dies. Similarly, in this example, the second die package also includes a second isolation layer. The second isolation layer is formed adjacent to the second mold layer adjacent to the active faces of the second dies. The second isolation layer provides isolation for the second dies and also provides a structure in which additional interconnects can be formed that are coupled to the die interconnects of the second dies of the second mold layer for signal routing to the second dies. For example, the second isolation layer may also include RDLs to form interconnects to the die interconnects of the seconds dies. In this example, the interconnects of the first and second isolation layers of the first and second die packages are coupled to each other as a result of the first and second die packages being coupled together, to form D2D interconnections. The antenna is coupled to the antenna module by being disposed on a third isolation layer that is disposed on the side of the second die package that faces the inactive face of the second dies with interconnects formed therein and coupled to antenna elements, to provide antennas for the antenna module.

In yet another exemplary aspect, to provide for the integration of a circuit (e.g., a power amplifier) in the second die package of the antenna module that generates heat that needs to be dissipated for efficient operation of the RF transceiver, thermal vertical interconnect accesses (vias) (e.g., through mold vias (TMVs)) are disposed in the first mold layer of the first die package. The thermal vias are coupled with interconnects formed in the first isolation layer adjacent to the first mold layer as part of D2D interconnections, which are then coupled to interconnects in the second isolation layer of the second die package. This couples the thermal vias to die interconnects of a second die in the second die package to provide a heat sink for the second die. The thermal vias of the first die package can be coupled to interconnects of an application circuit board to provide a heat dissipation path from the second die of the antenna module. In this manner, a heat sink structure can be provided and coupled to the first die package without an antenna module disposed adjacent to the first die package and interfering with providing a heat dissipation path. The arrangement of the first and second die packages being coupled to each other in a vertical direction in a 3D stacked arrangement, with active faces of their respective first and second dies facing each other, makes possible an efficient heat dissipation path from the second die through the first die package on an opposite side of the antenna in the antenna module.

In this regard, in one exemplary aspect, an antenna module is provided. The antenna module comprises a first die package that comprises a first mold layer encapsulating a first die having a first active face, and a first isolation layer adjacent to the first mold layer and the first active face of the first die. The first isolation layer comprises a first interconnect coupled to the first active face of the first die and exposed through a first surface of the first isolation layer. The antenna module also comprises a second die package that comprises a second mold layer encapsulating a second die having a second active face, and a second isolation layer adjacent to the second mold layer and the second active face of the second die. The second isolation layer comprises a second interconnect coupled to the second active face of the second die and exposed through a second surface of the second isolation layer. The second surface of the second isolation layer is coupled to the first surface of the first isolation layer to couple the first interconnect to the second interconnect.

In another exemplary aspect, a method of fabricating an antenna module. The method comprises forming a first die package, which comprises forming a first mold layer encapsulating a first die having a first active face, and forming a first isolation layer adjacent to the first mold layer and the first active face of the first die. The first isolation layer comprises a first interconnect coupled to the first active face of the first die and exposed through a first surface of the first isolation layer. The method also comprises forming a second die package which comprises, forming a second mold layer encapsulating a second die having a second active face, and forming a second isolation layer adjacent to the second mold layer and the second active face of the second die. The second isolation layer comprises a second interconnect coupled to the second active face of the second die and exposed through a second surface of the second isolation layer. The method also comprises coupling the second surface of the second isolation layer to the first surface of the first isolation layer to couple the first interconnect to the second interconnect.

BRIEF DESCRIPTION OF THE FIGURES

FIGS. 6A-6D is a flowchart illustrating another exemplary fabrication process for fabricating an antenna module that includes a 3D build-up on mold package that includes a first and second mold layers encapsulating respective dies with their active faces facing each other with the first and second mold layers coupled to each other in a vertical direction in a 3D stacked arrangement, to provide a reduced distance between the active faces of the first and second dies, including the antenna module in FIGS. 2A and 2B;

FIGS. 7A-7H illustrate exemplary fabrication stages during fabrication of the antenna module fabricated according to the fabrication process in FIGS. 6A-6D;

DETAILED DESCRIPTION

Figure 1:
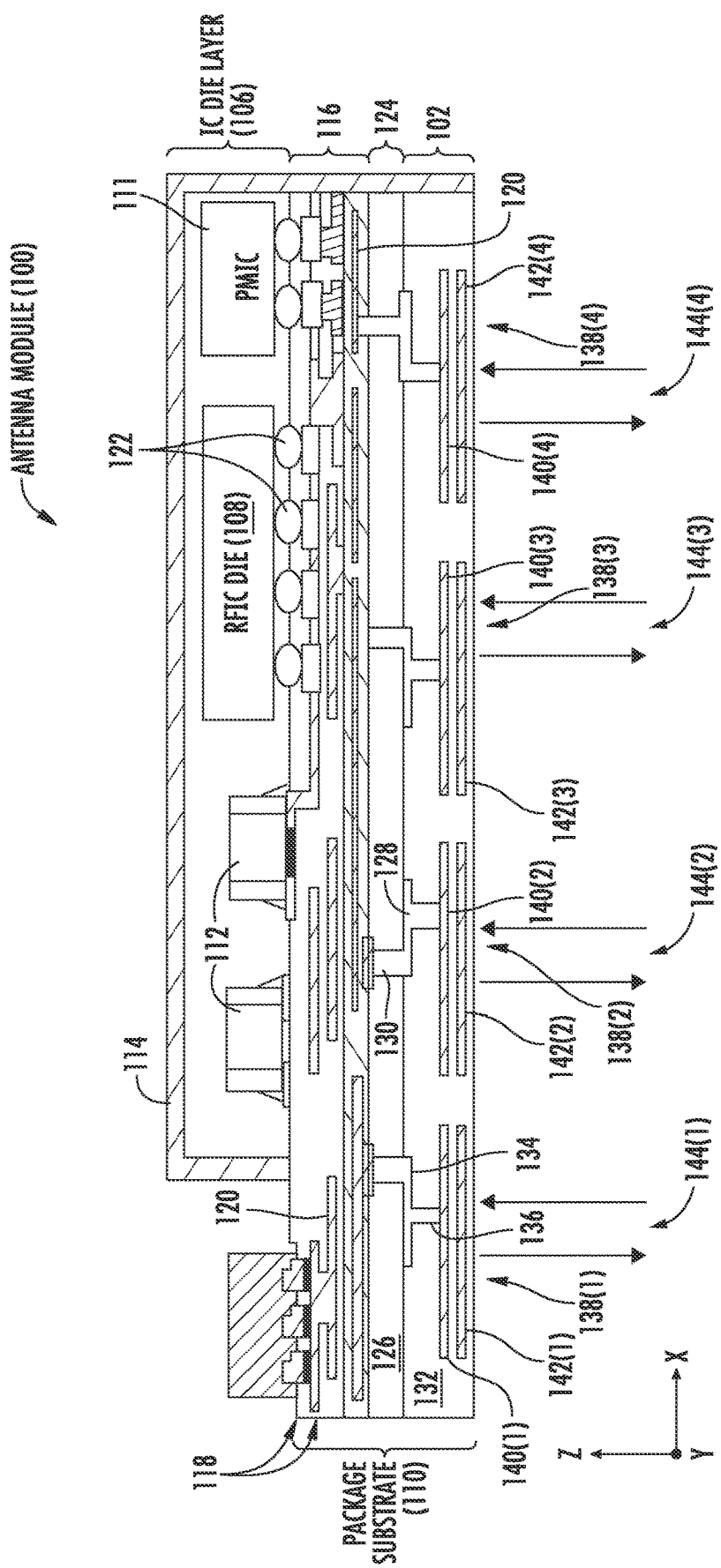
FIG. 1 is a side view of an antenna module in the form of a radio-frequency (RF) integrated circuit (IC) (RFIC) package that includes a package substrate supporting antennas formed in metallization layers of the package substrate.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include antenna modules employing three-dimensional (3D) build-up on mold package to support efficient integration of radio-frequency (RF) circuitry. Related fabrication methods are also disclosed. The antenna module is designed be mounted and coupled to an application circuit board of an electronic device (e.g., a millimeter (mm) Wave communications device) to provide an RF communication capability for the electronic device. In exemplary aspects, the antenna module includes a RF transceiver whose circuitry is split over multiple semiconductor dies ("dies") so different semiconductor devices can be formed in different types of semiconductor structures. For example, it may be desired for performance reasons for certain amplifier circuits of the RF transceiver to be formed in a III-V semiconductor structure, whereas other circuits of the RF transceiver are formed in a IV-VI silicon semiconductor structure. Die-to-die (D2D) interconnections are provided to allow circuits from different dies to be electrically coupled to each other. Thus, it is also desired to minimize the signal routing paths between the multiple dies of the RF transceiver to reduce losses. Thus, in exemplary aspects, 3D stacking of these dies is employed in the antenna module to reduce the lengths of D2D interconnections between circuits in different dies as well as to reduce the mounting area of the antenna module on a circuit board. However, it is also desired to mitigate any increased electro-magnetic interference (EMI) between the dies that may result from the dies being located closer to each other as a resulting to their 3D stacking than would otherwise be the case if such dies were provided in a side-by-side configuration in an antenna module. Heat management and its efficient dissipation may also be more difficult in a 3D stacked antenna module.

Thus, in other exemplary aspects disclosed herein, the antenna module is provided as a 3D build-up on mold package. This reduces the length of the D2D interconnections between dies in different stacked layers in the antenna module to reduce RF transceiver losses and well as provide other exemplary benefits. In this regard, in an exemplary aspect, the antenna module includes a first die package that is a first build-on-mold package. The first die package includes one or more first dies as part of a RF transceiver. For example, the first die package may include a die that includes variable-gain amplifier (VGA) and another die that includes a mixer circuit for the RF transceiver and RF receiver. The first dies are encapsulated by a first mold layer in the first die package. First die interconnects are disposed on and coupled to the active faces of the first dies and are exposed from a top surface of the first mold layer to expose die connections to the first dies. The antenna module also includes a second die package that is a second build-on-mold package. The second die package includes one or more second dies as part of the RF transceiver. For example, the second die package may include a power amplifier for a RF transmitter and a low-noise amplifier (LNA) for the RF receiver. The second dies are encapsulated by a second mold layer of the second die package. Second die interconnects are disposed on and coupled to the active face of the second dies and are exposed from a top surface of the second mold layer to expose die connections to the second dies. The first and second die packages are coupled to each other in a vertical direction in a 3D stacked arrangement, with the active faces of their respective first and second dies facing each other, to provide a reduced distance between the active faces of the first and second dies. This allows for reduced length D2D interconnections between the first and second dies of the first and second die packages to reduce RF transceiver losses. An antenna is coupled to the second die package to provide an antenna(s) for the antenna module.

Before discussing examples of an antenna module that includes a three-dimensional (3D) build-up on mold package that includes a first and second mold layers encapsulating respective dies with the first and second mold layers coupled to each other in a vertical direction in a 3D stacked arrangement, an example of an antenna module 100 that does not include stacked build-on mold layers is first described with regard to FIG. 1 below.

In this regard, FIG. 1 is a view of an antenna module 100 that is a RFIC package that is configured in a side-by-side arrangement. The antenna module 100 includes an antenna substrate 102 that supports antenna elements (e.g., patch and/or dipole antenna elements) for supporting RF communications. The antenna module 100 includes an IC die layer 106 disposed in a horizontal plane (X-axis and Y-axis direction plane) and that includes an RFIC chip 108 that includes a semiconductor die that includes an encapsulated RF transceiver. The antenna module 100 could also include a separate adjacent power management IC (PMIC) chip 111 as shown in FIG. 1 that provides a power source for the RFIC die chip. The RFIC chip 108 and PMIC chip 111 are arranged in a side-by-side arrangement in a horizontal direction (X-axis direction). The IC die layer 106 also includes other passive components 112 (e.g., capacitors, inductors) that are electrically coupled through the package substrate 110 to the RFIC chip 108 and/or the PMIC chip 111 as part of the circuits formed therein. The size of these passive components 112 may be such that it is not desirable or not feasible to integrate them into the RFIC chip 108 or the PMIC chip 111. The IC die layer 106 is mounted to a package substrate 110 to provide a support structure for the IC die layer 106 and to also provide an interconnect structure for coupling the RFIC chip 108 to other components and circuits in the antenna module 100. An electromagnetic interference (EMI) shield 114 is disposed around the RFIC chip 108 and other components in the IC die layer 106.

With continuing reference to FIG. 1, in this example, the package substrate 110 includes a metallization substrate 116 that is adjacent to the IC die layer 106. The metallization substrate 116 includes a plurality of substrate metallization layers 118 that each include metal interconnects 120 (e.g., pads, vertical interconnect accesses (vias), traces, lines) formed therein for providing interconnection structures to facilitate interconnections to provide an electrical interface between the RFIC chip 108 and other components and circuits in the antenna module 100. Die interconnects 122 couple the RFIC chip 108 to the metal interconnects 120 in the metallization substrate 116. The metallization substrate 116 may be a coreless substrate. The substrate metallization layers 118 could be formed as separate substrate layers that are laminated together to form the metallization substrate 116. In this example, the metallization substrate 116 is coupled to a core substrate 124 as part of the package substrate 110. The core substrate 124 also includes one or more metallization layers 126 that include metal interconnects 128 coupled to vertical interconnect accesses (vias) 130 (e.g., metal pillars) coupled to metal interconnects 120 in the adjacent metallization substrate 116 to provide electrical connectivity between the metallization substrate 116 and the core substrate 124.

With continuing reference to FIG. 1, the package substrate 110 in the antenna module 100 also includes the antenna substrate 102. The antenna substrate 102 is coupled to the core substrate 124 such that the core substrate 124 is disposed between the antenna substrate 102 and the metallization substrate 116 in the vertical direction (Z-axis direction) in this example. The antenna substrate 102 also includes one or more metallization layers 132 that include metal interconnects 134 coupled to vias 136 coupled to metal interconnects 128 in the core substrate 124. The antenna substrate 102 includes four (4) antennas 138(1)-138(4) in this example, which include metal patches, that are electrically coupled to the RFIC chip 108 through interconnections between the antenna 138(1)-138(4) and the metal interconnects 120, 128, 134 in the respective metallization substrate 116, core substrate 124, and antenna substrate 102. In this example, each antenna 138(1)-138(4) is a patch antenna that includes antennal elements in the form of first metal patches 140(1)-140(4) adjacent to the core substrate 124 and second metal patches 142(1)-142(4) disposed below the respective first metal patches 140(1)-140(4). The first metal patches 140(1)-140(4) are coupled to the RFIC chip 108 through the via 136 and the metal interconnects 134, 128, 120 acting as an antenna feed line. The second metal patches 142(1)-142(4) are not in contact with the first metal patches 140(1)-140(4), but are configured to be electromagnetically (EM) coupled to the first metal patches 140(1)-140(4) when the first metal patches 140(1)-140(4) receive a RF signal to be radiated. Similarly, when the second metal patches 142(1)-142(4) are energized by a received RF signal, the second metal patches 142(1)-142(4) are EM coupled to the first metal patches 140(1)-140(4) with the received RF signal.

It may be desired to reduce the size of an antenna module, such as the antenna module 100 in FIG. 1. As shown in FIG. 1, the package substrate 110 is sized to be able to support the coupled antenna substrate 102 and IC die layer 106 that includes the RFIC chip 108, the PMIC chip 111, and other passive components 112. If you increase frequency band capability of the RFIC chip 108 in the antenna module 100 in FIG. 1 (e.g., from Frequency Range 2 (FR2) in frequency bands from 24.25 GigaHertz (GHz) to 52.6 GHz. frequencies to millimeter Wave (mmWave) frequencies in frequency bands from (e.g., 30 to 300 Ghz), the size of antennas 138(1)-183(4) decreases as function of the square of the wavelength of frequency. Advances in node size reduction in semiconductor dies may also have the effect of reducing the RFIC chip 108 size in the antenna module 100 over time as the antenna module 100 undergoes revision and redesign. However, it may not be possible to reduce the size of an RFIC die in an antenna module at the same proportion as a reducing the size of its antennas. Thus, the size of the RFIC chip may still be a limiting factor in the ability to reduce the overall size of an antenna module even if the antenna(s) in the antenna module are reduced significantly.

Also, as the supported frequencies of a RF transceiver in the RF chip 108 in the antenna module 100 increase, other types of semiconductors materials other than silicon may be employed in RFIC chip 108 to support higher frequency and power requirements. In this regard, as an example, a RF transceiver in the RFIC chip 108 in the antenna module 100 in FIG. 1 may incorporate III-V semiconductor devices, such as high-electron-mobility transistors (HEMTs). There may be a need to incorporate such III-V semiconductor devices along with silicon-based semiconductor devices in an antenna module, such as the antenna module 100 in FIG. 1, wherein multiple dies are required to provide different silicon-based and III-V semiconductor layers for a RF transceiver. Additional interconnects thus may be required to provide signal routing paths for the RF transceiver in an antenna module, because in this example, the circuits of the RF transceiver are split between circuits in multiple dies having different semiconductor layers to support different types of semiconductor devices. Thus, it is desired to minimize the length of these interconnects to minimize insertion losses of the RF transceiver. Further, providing EMI shielding in an antenna module is also desired to reduce or avoid EMI between components in the RF transceiver, such as between a power amplifier (PA) and low-noise amplifier (LNA) of the RF transceiver.

Figure 2A:
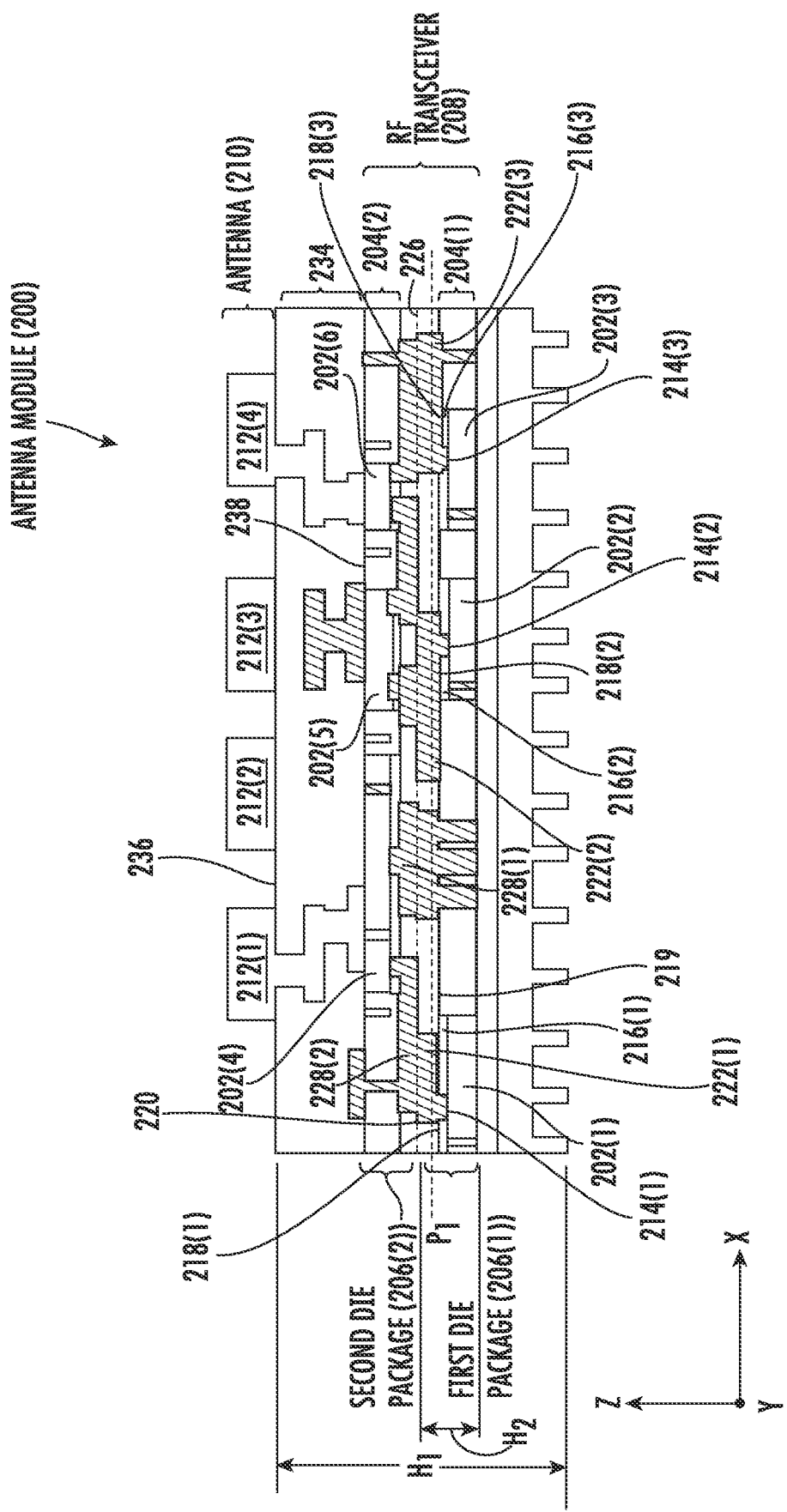
FIGS. 2A and 2B are side views of an exemplary antenna module that includes a three-dimensional (3D) build-up on mold package that includes first and second mold layers encapsulating respective semiconductor dies ("dies") with their active faces facing each other with the first and second mold layers coupled to each other in a vertical direction in a 3D stacked arrangement, to provide a reduced distance between the active faces of the first and second dies.
Figure 2B:
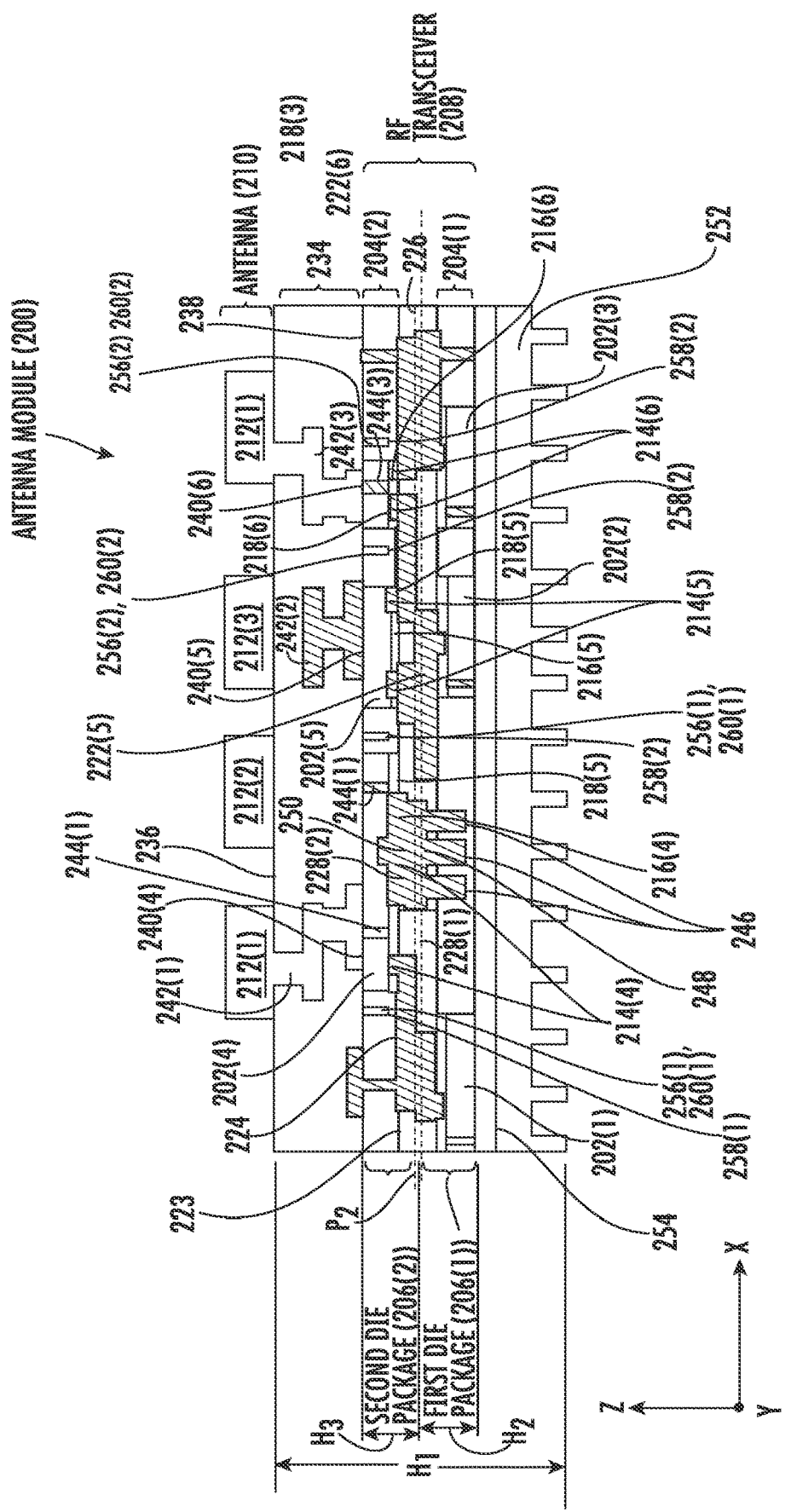

In this regard, FIGS. 2A and 2B are side views of an exemplary antenna module 200 that includes a three-dimensional (3D) build-up on mold package to support efficient integration of RF circuitry that can be located over multiple types of dies employing different semiconductor layers. As discussed in more detail below, the antenna module 200 is provided as a 3D build-up on mold package to reduces the length of the D2D interconnections between dies 202(1)-202(6) in different first and second mold layers 204(1), 204(2) of respective first and second stacked die packages 206(1), 206(2). This reduces the length of D2D interconnections between the dies 202(1)-202(6) to reduce RF transceiver losses and well as provide other exemplary benefits. In this example, circuits of a RF transceiver 208 are distributed among the different dies 202(1)-202(6) in the stacked first and second stacked die packages 206(1), 206(2) in a vertical direction (Z-axis direction). Thus, D2D interconnections are provided to coupled circuits distributed over these different dies 202(1)-202(6). This allows the flexibility of providing different types of dies 202(1)-202(6) with different semiconductor layers exhibiting different electrical properties to facilitate providing heterogenous circuits in the RF transceiver 208 without having to incorporate multiple dies in a single chip. For example, some of the dies 202(1)-202(6) may include a type IV-V semiconductor layer to provide an active layer for the formation of semiconductor devices, whereas other dies 202(1)-202(6) may include a type III-V semiconductor layer to provide a different type of active layer for the formation of semiconductor devices. In this manner, different semiconductor devices of the RF transceiver 208 can be formed in different types of semiconductor layers to optimize their performance.

In this example, the die 202(1) in the antenna module 200 incorporates a switching mode circuit that provides mode control for a RF receiver and RF transmitter in the RF transceiver 208. Die 202(2) incorporates a mixer circuit that provides frequency up and down conversion for the RF transceiver 208. Die 202(3) incorporates a variable gain amplifier (VGA) circuit that provides gain control for both the RF receiver and RF transmitter in the RF transceiver 208. Die 202(4) incorporates a PA circuit as part of a RF transmitter that amplifies a RF signal to be transmitted as a high power RF signal. Die 202(5) incorporates a beamformer circuit as part of a RF transmitter that amplifies a RF signal to be transmitted as a high power RF signal. Die 202(6) incorporates a low-noise amplifier (LNA) circuit as part of a front-end of a RF receiver that amplifies received RF signal to be processed. As discussed above, because the circuits of the RF transceiver 208 are distributed over the multiple dies 202(1)-202(6) in the antenna module 200, it is desired to provide D2D interconnections to couple different circuits among the dies 202(1)-202(6) as part of the RF transceiver 208. It is also desired to provide interconnections between the PA circuit in die 202(4) and the LNA circuit in die 202(6) to an antenna 210 (e.g., a patch antenna) that is formed of multiple antenna elements 212(1)-212(4) (e.g., metal patches) in this example.

As shown in the side view of the antenna module 200 in FIG. 2A, to provide for the multiple dies 202(1)-202(6) to be packaged in the antenna module 200 with D2D interconnections with minimizing the height $H_1$ of the antenna module 200 in the vertical direction (Z-axis direction), the multiple dies 202(1)-202(6) are disposed in the stacked first and second die packages 206(1), 206(2) that are build-on mold die packages. In this example, the first die package 206(1) includes the first mold layer 204(1), that is made from a mold material, such as a polymer or resin material as examples. The dies 202(1)-202(3) are encapsulated (e.g., over molded) by the first mold layer 204(1). By encapsulation, it is meant that the dies 202(1)-204(3) are at least partially surrounded by the mold material of the first mold layer 204(1), with the mold material of the first mold layer 204(1) disposed adjacent to at least portions of the dies 202(1)-204(3). Metal die interconnects 214(1)-214(3) are formed in a respective outer back-end-of-line (BEOL) metallization layers 216(1)-216(3) on respective active faces 218(1)-218(3) of the respective dies 202(1)-202(3) to provide connection access to the respective dies 202(1)-202(3). The die interconnects 214(1)-214(3) may be formed out of copper or other metal material. The die interconnects 214(1)-214(3) are exposed from a top surface 219 of the first mold layer 204(1) to expose die connections to the respective dies 202(1)-202(6) for interconnection. Because the dies 202(1)-202(3) are encapsulated in the first mold layer 204(1) of the first die package 206(1), a gap area is not present between the dies 202(1)-202(3) and metal interconnects 222(1)-222(3) (e.g., metal lines, metal traces, metal redistribution layers (RDLs)) that are coupled to the die interconnects 214(1)-214(3) to provide interconnections to the dies 202(1)-202(3), thus minimizing the height $H_2$ of the first die package 206(1).

Figure 3:
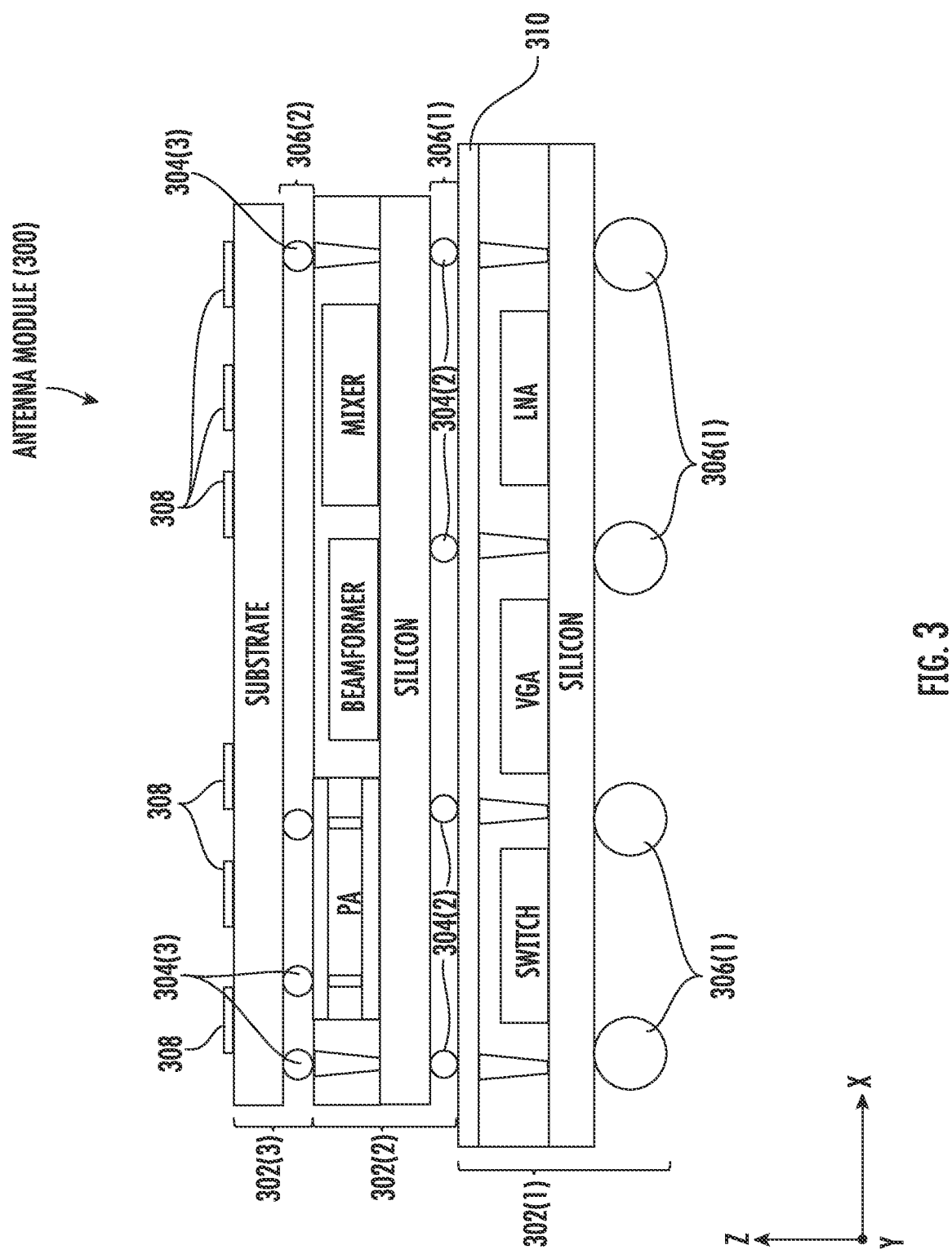
FIG. 3 is a side view of an alternative antenna module that has first and second die packages bonded together by wafer-to-wafer bonding, wherein the second die package is coupled to the first die package through external metal interconnects coupled to an interposer layer of the first die package.

For example, an alternative antenna module 300 in FIG. 3 includes separate RF circuit wafer packages 302(1), 302(2) and antenna wafer package 302(3) that are not build-on mold packages. The wafer packages 302(1)-302(3) are stacked on each other in the vertical direction (Z-axis direction) and are coupled together through external interconnects 304(2)-304(3) (e.g., solder balls). This creates gaps 306(1), 306(2) are present between the wafer packages 302(1)-302(3), adding to the overall height of the antenna module 300 in the vertical direction (Z-axis direction) in an undesirable manner. Also, D2D interconnections between dies in the wafer packages 302(1), 302(2) and to the antenna elements 308 in the antenna wafer package 302(3) must be longer length connections that go between respective wafer packages 302(1)-302(3) through the external interconnects 304(2)-304(3) and potentially even an interposer substrate 310 as shown.

With reference back to the antenna module 200, as shown in the side view of the antenna module 200 in FIG. 2B, the second die package 206(2) of the antenna module 200 includes the second mold layer 204(2), that is made from a mold material, such as a polymer or resin material as examples. The dies 202(4)-202(6) are encapsulated (e.g., over molded) by the second mold layer 204(2). By encapsulation, it is meant that the dies 202(4)-204(6) are at least partially surrounded by the mold material of the second mold layer 204(2), with the mold material of the second mold layer 204(2) disposed adjacent to at least portions of the dies 202(2)-204(6). Metal die interconnects 214(4)-214(6) are formed in a respective outer back-end-of-line (BEOL) metallization layers 216(4)-216(6) on respective active faces 218(4)-218(6) of the respective dies 202(4)-202(6) to provide connection access to the respective dies 202(4)-202(6). The die interconnects 214(4)-214(6) may be formed out of copper or other metal material. The die interconnects 214(4)-214(6) are exposed from a top surface 223 of the second mold layer 204(2) to expose die connections to the respective dies 202(4)-202(6) for interconnection. Because the dies 202(4)-202(6) are encapsulated in the second mold layer 204(2) of the second die package 206(2), a gap area is also not present between the dies 202(4)-202(6) and interconnects 222(4)-222(6) (e.g., metal lines, metal traces, metal redistribution layers (RDLs)) that are coupled to the die interconnects 214(4)-214(6) to provide interconnections to the dies 202(4)-202(6), thus minimizing the height $H_3$ of the second die package 206(2).

As shown in FIGS. 2A and 2B, the second die package 206(2) is stacked on and coupled to the first die package 206(1) in a vertical direction (Z-axis direction) in a 3D stacked arrangement to form the antenna module 200. In this example, the second die package 206(2) is coupled to the first die package 206(1) such that the respective active faces 218(4)-218(6) of the dies 202(4)-202(6) in the second mold layer 204(2) of the second die package 206(1) are adjacent to and face the respective active faces 218(1)-218(3) of the dies 202(1)-202(3) in the first mold layer 204(1) of the first die package 206(1). This 3D coupling arrangement provides a reduced distance between the active faces 218(1)-218(3), 218(4)-218(6) of the dies 202(1)-202(3), 202(4)-202(6) to facilitate reduced length D2D interconnections between the dies 202(1)-202(3), 202(4)-202(6) of the first and second die packages 206(1), 206(2). For example, the second die package 206(2) may be directly bonded to the first die package 206(1) by a bond 226, such as through compression to form a compression bond between the first and second die packages 206(1), 206(2). Alternatively, an adhesive could be disposed between the first and second die packages 206(1), 206(2) to couple them together to form the bond 226.

In this regard, in this example, as shown in FIGS. 2A and 2B, first and second isolation layers 228(1), 228(2) of the respective first and second die packages 206(1), 206(2) are coupled to each other to couple the first and second die packages 206(1), 206(2) together. As shown in FIG. 2A, the first isolation layer 228(1) is disposed in a horizontal direction (X-axis and Y-axis directions) in a first plane $P_1$ adjacent to the first mold layer 204(1) and the active faces 218(1)-218(3) of the respective dies 202(1)-202(3). The first isolation layer 228(1) provides electrical isolation to the dies 202(1)-202(3) in the first mold layer 204(1). The first isolation layer 228(1) may be made from a dielectric material that can provide electrical insulation and isolation, such as a polymer material for example. As shown in FIG. 2B, the second isolation layer 228(2) is disposed in a horizontal direction (X-axis and Y-axis directions) in a second plane $P_2$ parallel to the first plane $P_1$ and adjacent to the second mold layer 204(2) and the active faces 218(4)-218(6) of the respective dies 202(4)-202(6). The second isolation layer 228(2) provides electrical isolation to the dies 202(4)-202(6) in the second mold layer 204(1). The second isolation layer 228(2) may be made from a dielectric material that can provide electrical insulation and isolation, such as a polymer material for example.

As shown in FIG. 2A, the interconnects 222(1)-222(3) of the first die package 206(1) that are coupled to the respective dies 202(1)-202(4) are disposed in the first isolation layer 228(1). For example, the interconnects 222(1)-222(3) may be formed as RDLs in the first isolation layer 228(1). The interconnects 222(1)-223(3) of the first die package 206(1) are exposed through a respective top surface 220 of the first isolation layer 228(1). As shown in FIG. 2B, the interconnects 222(4)-222(6) of the second die package 206(2) that are coupled to the respective dies 202(4)-202(6) are disposed in the second isolation layer 228(2). For example, the interconnects 222(4)-222(6) may be formed as RDLs in the second isolation layer 228(2). The interconnects 222(4)-223(6) of the second die package 206(2) are exposed through a respective top surface 232 of the second isolation layer 228(2). Thus, as shown in FIGS. 2A and 2B, when the top surfaces 220, 232 of the respective first and second isolation layers 228(1), 228(2) are brought together to couple their respective first and second die packages 206(1), 206(2) together in the vertical direction (Z-axis direction) orthogonal to the first and second planes $P_1$, $P_2$, the interconnects 222(1)-223(3) exposed from the first isolation layer 228(1) are brought into contact with respective interconnects 222(4)-223(6) exposed from the second isolation layer 228(1) to provide part of the compression bond 226 and to provide D2D interconnections between the respective dies 202(1)-202(3), 202(4)-202(6). The coupling of the respective interconnects 222(1)-223(3), 222(4)-222(6) in the respective first and second isolation layers 228(1), 228(2) of the respective first and second die packages 206(1), 206(2) provides a signal coupling path between the respective dies 202(1)-202(3), 202(4)-202(6).

Also, as shown in FIGS. 2A and 2B, as discussed above, the antenna module 200 includes an antenna 210. The antenna 210 is packaged in the antenna module 200 by its antenna elements 212(1)-212(4) being formed on another, third isolation layer 234 that is coupled to the second die package 206(2) in a vertical direction (Z-axis direction). The third isolation layer 234 is made from a dielectric material, such as a polymer material and provides electrical isolation for the antenna elements 212(1)-212(4). As shown in FIG. 2B, the third isolation layer 234 includes a top surface 236 that the antenna elements 212(1)-212(4) are disposed on. The third isolation layer 234 also includes a bottom surface 238 that is adjacent to the second mold layer 204(2) and second inactive faces 240(4)-240(6) of the respective dies 202(4)-202(6). The third isolation layer 234 includes interconnects 242(1)-242(3) (e.g., metal lines, metal traces, metal redistribution layers (RDLs)) that are coupled to respective inactive faces 240(4), 240(6) of the respective dies 202(4), 202(6), which in this example include a PA circuit and a LNA circuit. This provides antenna connections between the dies 202(4), 202(6) and the antenna elements 212(1), 212(4) of the antenna 210. Because the third isolation layer 234 is adjacent to the inactive faces 240(4), 240(6) of the respective dies 202(4), 202(6), in this example, to provide a connection between the interconnects 242(1), 242(3) and the respective dies 202(4), 202(6), through-vias 244(1), 244(3) are disposed through the respective dies 202(4), 202(6). The through-vias 244(1), 244(3) are coupled to the interconnects 242(1), 242(3) and the active faces 218(4), 218(6) of the respective dies 202(4), 202(6) to couple circuits in the dies 202(4), 202(6) to the antenna 210.

With reference back to FIG. 2A, it may be desired to provide a heat dissipation path from a die 202(4)-202(6) in the second die package 206(2). For example, the die 202(4)-202(6) may include a high power PA circuit that generates heat that can negatively affect performance of the RF transceiver 208 unless the heat generated by the PA circuit is dissipated. However, a heat dissipation path is not provided above the die 202(4) in the vertical direction (Z-axis direction) in the third isolation layer 234, because this would interfere with the antenna 210. Thus, in this example, a heat dissipation path can be provided from the first die package 206(1) to the second die package 206(2) because of their close proximity to each other and the coupling of the respective interconnects 222(1)-222(3), 222(4)-222(6). In this regard, as shown in FIG. 2B, by providing the first die package 206(1) as a build-on mold package with the first mold layer 204(1), thermal vias 246 can be easily formed in the first mold layer 204(1) and coupled to the die 202(4) through interconnects 248 in the first isolation layer 228(1) coupled to interconnects 250 in the second isolation layer 228(2). For example, the thermal vias 246 (e.g., copper vias) could be through-mold vias (TMVs), and may be formed as thicker vias (e.g., 500 micrometers (μm)) than signal path vias. In this manner, a conductive path is provided from the die 202(4) through the interconnects 250, 248 in the respective second and first isolation layers 228(2), 228(1) to the thermal vias 246 to dissipate heat from the die 202(4). As an example, as shown in FIG. 2B, a heat sink 252 as a conductive structure may be disposed adjacent to a bottom surface 254 of the first mold layer 204(1) and coupled to the thermal vias 246 to conduct dissipated heat.

Figure 4:
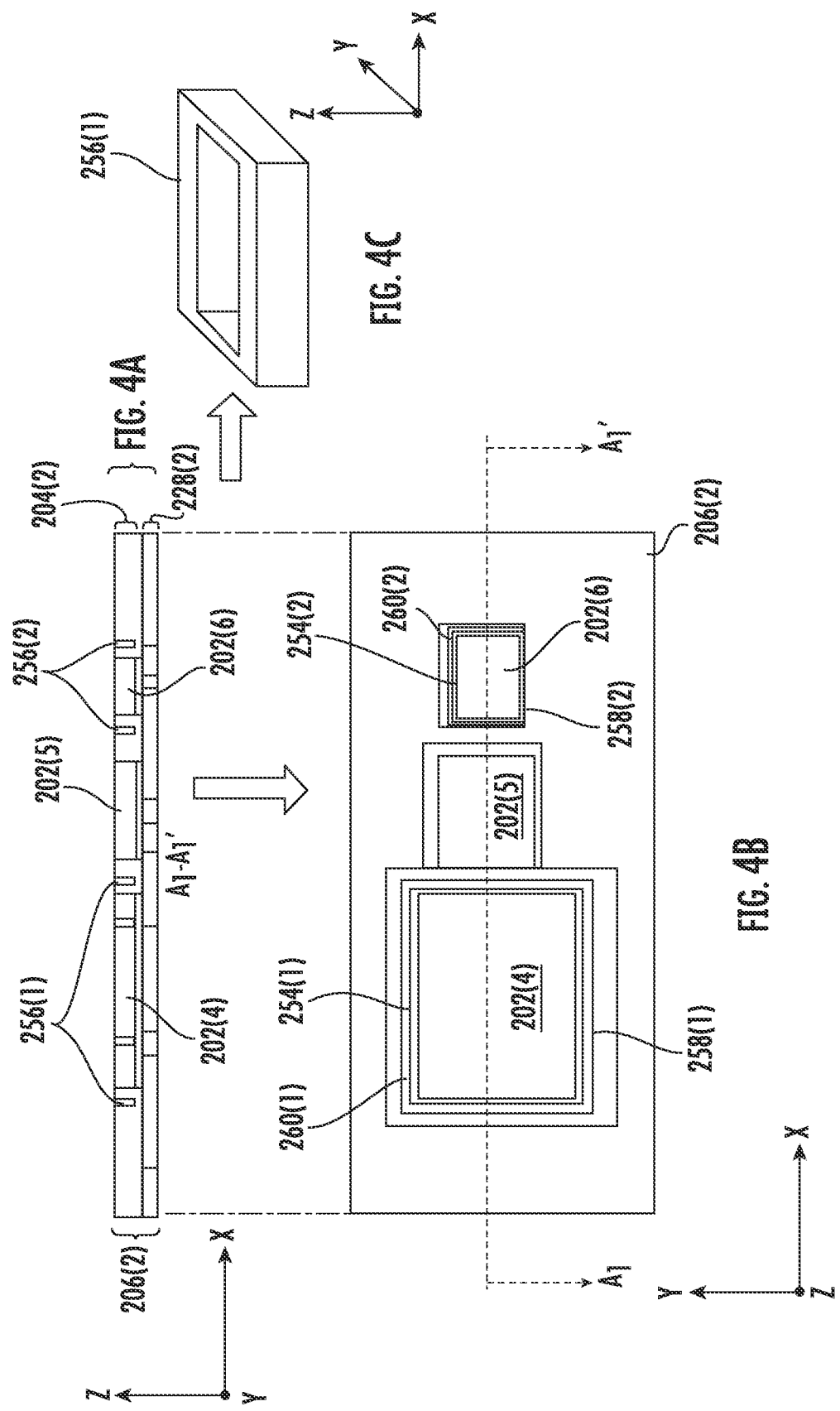
FIGS. 4A and 4B are respective side and top views of the second die package of the antenna module in FIGS. 2A and 2B.
FIG. 4C is a perspective view of an electro-magnetic interference (EMI) shield formed around a die in the second mold layer of the second die package in FIGS. 4A and 4B.

With continuing reference to FIG. 2B, it may also be desired to RF shield one or more of the dies 202(1)-202(6), such as dies 202(4), 202(6) in the second die package 206(2). In this regard, in this example, as shown in FIG. 2B and in the side view of the second die package 206(2) in FIG. 4A, a first metal shield 256(1) is disposed in the second mold layer 204(2) and disposed around the die 202(4). FIG. 4C illustrates a perspective side view of the first metal shield 256(1) in the second die package 206(2) in FIG. 4A. Also in this example, as shown in FIG. 2B and of the side view of the second die package 206(2) in FIG. 4A, a second metal shield 256(2) is also disposed in the second mold layer 204(2) and disposed around the die 202(6). The metal shields 256(1), 256(2) provide RF shielding of the respective dies 202(4), 202(6). In FIGS. 2B and 4A, only the sides of the metal shield 256(1), visible in the Y-axis direction, are visible because FIG. 2B is a cross-sectional side view along the line $A_1$-$A_1'$ of the antenna module 200 shown in its bottom view in FIG. 4B. However, the bottom view of FIG. 4B of the second die package 206(2) illustrates the metal shields 256(1), 256(2) fully surrounding their respective dies 202(4), 202(6). The metal shields 256(1), 256(2) can be formed to either partially or fully surround the respective dies 202(4), 202(6).

In this example, by forming the die package 206(1) as a build-on mold package with the second mold layer 204(1), this can facilitate an easier and more precise placement of the metal shields 256(1), 256(2) around the dies 202(4), 202(6). For example, as shown in FIG. 4B, and as discussed in more detail below, the second mold layer 204(2) can be etched to form trenches 258(1), 258(2) in the second mold layer 204(2). A conductive material 260(1), 260(2), such as a conductive metal paste, can be disposed in the trenches 258(1), 258(2) formed in the respective first and second mold layers 204(1), 204(2) to form the respective metal shields 256(1), 256(2).

Figure 5:
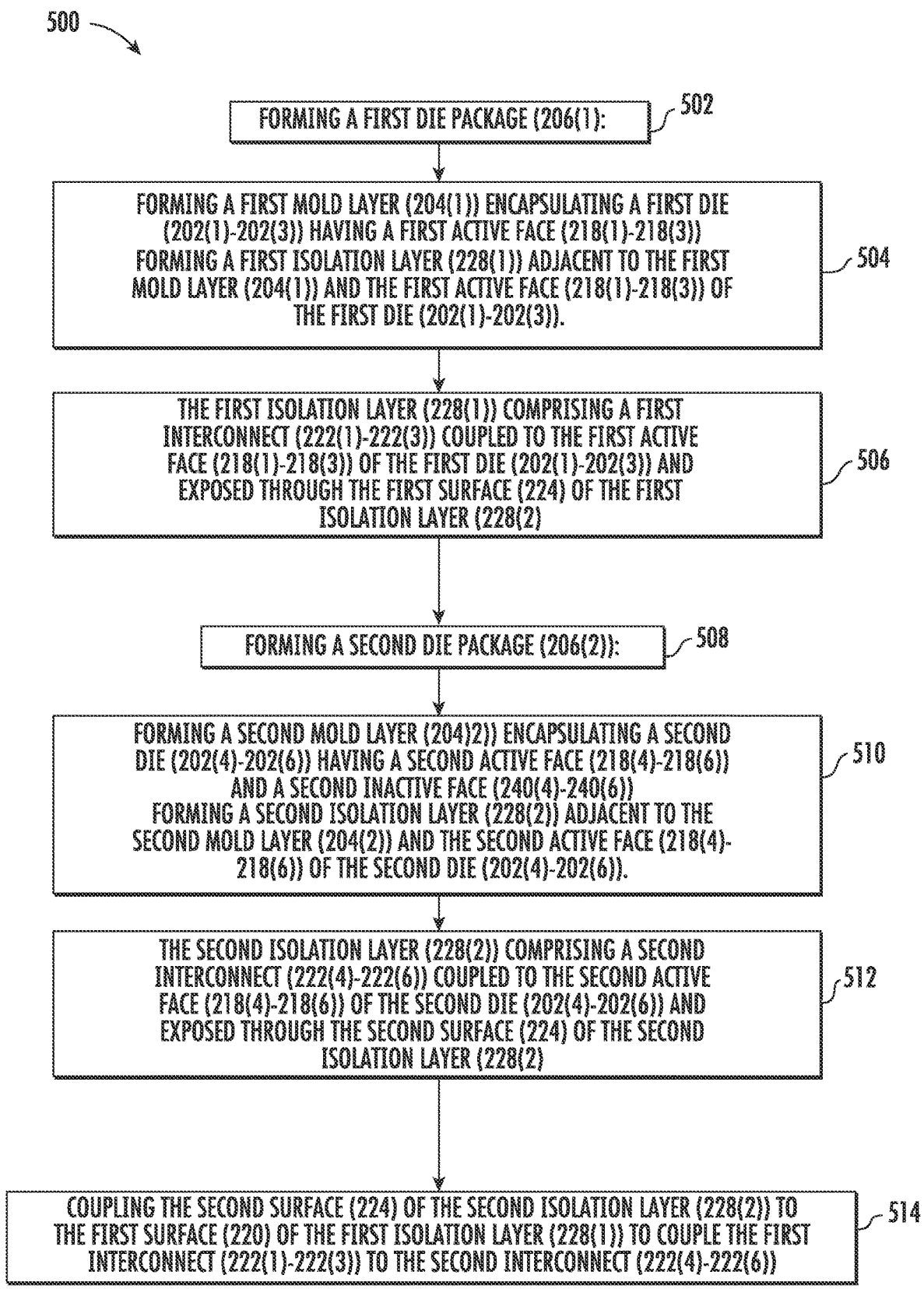
FIG. 5 is a flowchart illustrating an exemplary process for fabricating an antenna module that includes a 3D build-up on mold package that includes first and second mold layers encapsulating respective dies with their active faces facing each other with the first and second mold layers coupled to each other in a vertical direction in a 3D stacked arrangement, to provide a reduced distance between the active faces of the first and second dies, including the antenna module in FIGS. 2A and 2B.

There are various manners in which an antenna module that includes a 3D build-up on mold package that includes a first and second mold layers encapsulating respective dies with their active faces facing each other with the first and second mold layers coupled to each other in a vertical direction in a 3D stacked arrangement, to provide a reduced distance between the active faces of the first and second dies, including but not limited to, the antenna module 200 in FIGS. 2A and 2B, can be formed and fabricated. In this regard, FIG. 5 is a flowchart illustrating an exemplary fabrication process 500 for fabricating such an antenna module. The fabrication process 600 in FIG. 6 is discussed with regard to the antenna module 200 in FIGS. 2A and 2B as an example.

In this regard, as shown in FIG. 5, the fabrication process 500 includes forming a first die package 206(1) (block 502 in FIG. 5). Forming the first die package 206(1) includes forming a first mold layer 204(1) encapsulating a first die 202(1)-202(3) having a first active face 218(1)-218(3) (block 504 in FIG. 5). Forming the first die package 206(1) also includes forming a first isolation layer 228(1) adjacent to the first mold layer 204(1) and the first active face 218(1)-218(3) of the first die 202(1)-202(3), the first isolation layer 228(1) comprising a first interconnect 222(1)-222(3) coupled to the first active face 218(1)-218(3) of the first die 202(1)-202(3) and exposed through a first, top surface 220 of the first isolation layer 228(1) (block 506 in FIG. 5). The fabrication process 500 also includes forming a second die package 206(2) (block 508 in FIG. 5). Forming the second die package 206(2) includes forming a second mold layer 204(2) encapsulating a second die 202(4)-202(6) having a second active face 218(4)-218(6) and a second inactive face 240(4)-240(6) (block 510 in FIG. 5). Forming the second die package 206(2) also includes forming a second isolation layer 228(2) adjacent to the second mold layer 204(2) and the second active face 218(4)-218(6) of the second die (202(4)-202(6), the second isolation layer 228(2) comprising a second interconnect 222(4)-222(6) coupled to the second active face 218(4)-218(6) of the second die 202(4)-202(6) and exposed through the second, bottom surface 224 of the second isolation layer 228(2) (block 512 in FIG. 5). The fabrication process 500 also includes coupling the second, bottom surface 224 of the second isolation layer 228(2) to the first, top surface 220 of the first isolation layer 228(1) to couple the first interconnect 222(1)-222(3) to the second interconnect 222(4)-222(6) (block 514 in FIG. 5).

Other fabrication methods are also possible. For example, FIGS. 6A-6D is a flowchart of another exemplary fabrication process 600 for fabricating an antenna module like antenna module 200 in FIGS. 2A and 2B, and according to exemplary fabrication stages 700A-700H in FIGS. 7A-7H. The fabrication stages 700A-700D in FIGS. 7A-7H, according to the exemplary fabrication process 600 in FIG. 6, will now be discussed in regard to the antenna module 200 in FIGS. 2A and 2B as an example.

Figure 7A:
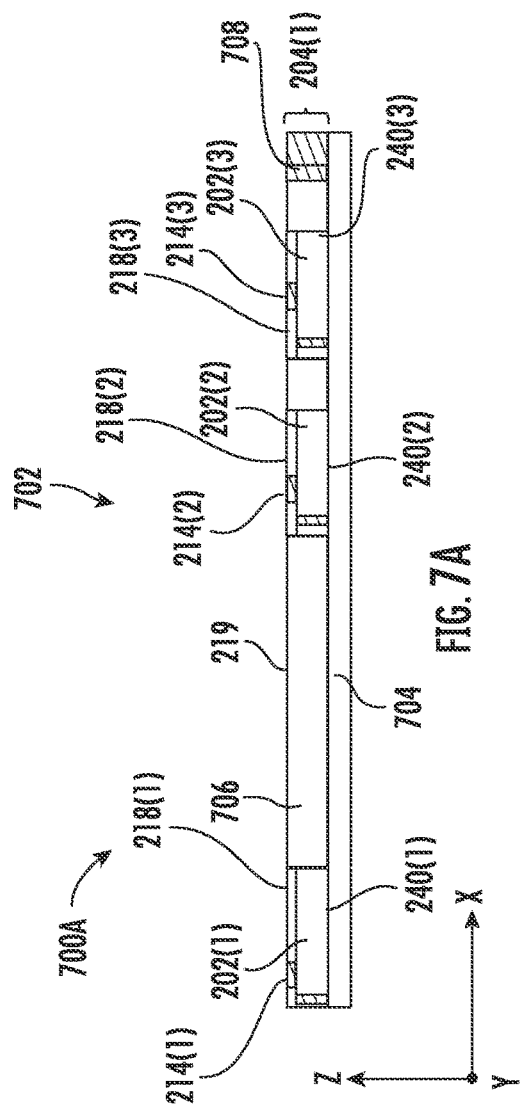
Figure 6A:
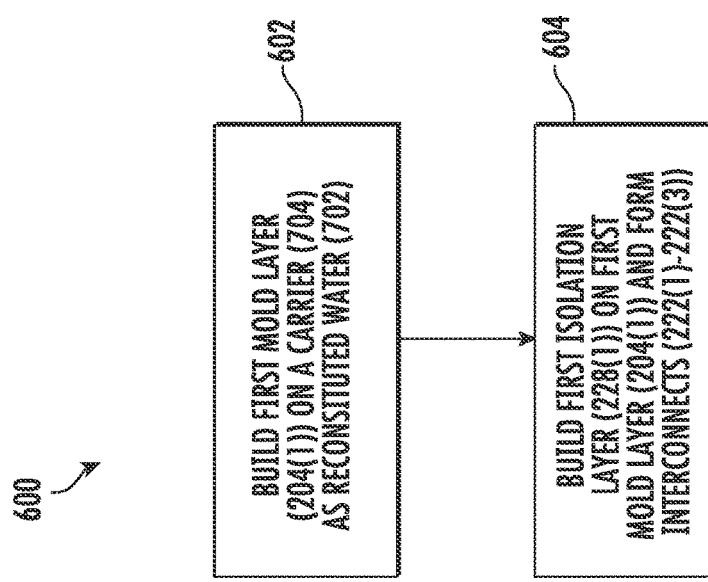

In this regard, as shown in exemplary fabrication stage 700A in FIG. 7A, a first step in the fabrication process 700 is to build the first mold layer 204(1) that will become part of the first die package 206(1) (block 602 in FIG. 6A). In this example, the first mold layer 204(1) is built as a reconstituted wafer 702. In this regard, a carrier 704 is provided. The dies 202(1)-202(3) are attached to the carrier 704 according to the desired arrangement and spacing. Inactive faces 240(1)-240(3) of the respective dies 202(1)-202(3) are coupled to the carrier 704 to attach the dies 202(1)-202(3) to the carrier 704. Thus, although not shown in FIG. 7A, note that the first mold layer 204(1) can be built on the carrier 704 that extends in the horizontal direction (X-axis and Y-axis directions) where other die 202(1)-202(3) arrangements are provided to eventually form multiple first die packages 206(1) for multiple antenna modules 200. Die interconnects 214(1)-214(3) have been formed in the active faces 218(1)-218(3) of the respective dies 202(1)-202(3). Thereafter, a molding material 706 is disposed on and adjacent the dies 202(1)-202(3) and in the spaces between the dies 202(1)-202(3) on the carrier 704 to overmold the dies 202(1)-202(3) to create the first mold layer 204(1). Then, as shown the fabrication stage 700A in FIG. 7A, vias 708 are formed in the first mold layer 204(1) to provide signal paths that will extend through the first mold layer 204(1) when the antenna module 200 is fully fabricated. The first mold layer 204(1) is then grinded down to the die interconnects 214(1)-214(3) to expose the die interconnects 214(1)-214(3) from a top surface 219 of the first mold layer 204(1).

Figure 7B:
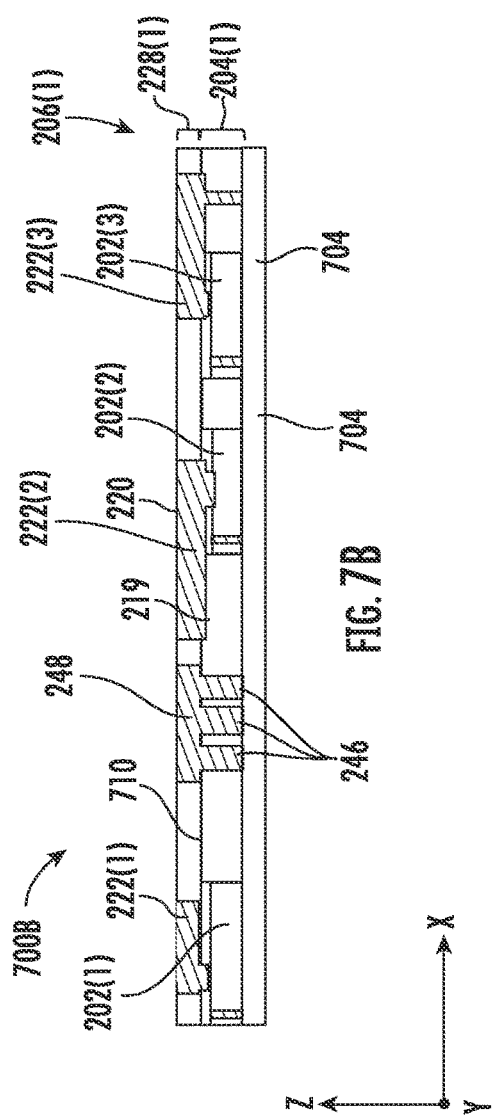

Then, as shown in exemplary fabrication stage 700B in FIG. 7B, a next step in the fabrication process 700 to fabricate the first die package 206(1) is to form and couple the first isolation layer 228(1) of the first mold layer 204(1) (block 604 in FIG. 6A). The thermal vias 246 are formed in the first mold layer 204(1) in this example before the first isolation layer 228(1) is formed on the first mold layer 204(1). For example, the thermal vias 246 may be formed by drilling or etching openings in the first mold layer 204(1) and then disposing a metal material in such openings. The first isolation layer 228(1) is then formed on the top surface 219 of the first mold layer 204(1). In this regard, a bottom surface 710 of the first isolation layer 228(1) is coupled to the top surface 219 of the first mold layer 204(1) and adjacent to the active faces 218(1)-218(3) of the respective dies 202(1)-202(3). The interconnects 222(1)-222(3), 248 are formed in the first isolation layer 228(1). For example, the interconnects 222(1)-222(3), 248 may be formed as RDLs in the first isolation layer 228(1) using a lithography process. The interconnects 222(1)-222(3) are exposed through a processing step, such as a chemical mechanical planarization (CMP) process, on the top surface 220 of the first isolation layer 228(1) to prepare the interconnects 222(1)-222(3) to be coupled to a second reconstituted wafer, discussed below, to form antenna modules 200.

Then, as shown in exemplary fabrication stage 700C in FIG. 7C, a next step in the fabrication process 700 is to build the second mold layer 204(2) that will become part of the second die package 206(2) (block 606 in FIG. 6B). In this example, the second mold layer 204(1) is also built as a reconstituted wafer 712. In this regard, a carrier 714 is provided. The dies 202(4)-202(6) are attached to the carrier 714 according to the desired arrangement and spacing. Inactive faces 240(4)-240(6) of the respective dies 202(4)-202(6) are coupled to the carrier 714 to attach the dies 202(4)-202(6) to the carrier 714. Thus, although not shown in FIG. 7C, note that the second mold layer 204(2) can be built on the carrier 714 that extends in the horizontal direction (X-axis and Y-axis directions) where other die 202(4)-202(6) arrangements are provided to eventually form multiple second die packages 206(2) for multiple antenna modules 200. Die interconnects 214(4)-214(6) have been formed in the active faces 218(4)-218(6) of the respective dies 202(4)-202(6). Thereafter, a molding material 716 is disposed on and adjacent the dies 202(1)-202(3) and in the spaces between the dies 202(4)-202(6) on the carrier 714 to overmold the dies 202(4)-202(6) to create the second mold layer 204(2). Then, as shown the fabrication stage 700C in FIG. 7C, vias 718 are formed in the second mold layer 204(2) to provide signal paths that will extend through the second mold layer 204(2) when the antenna module 200 is fully fabricated. The second mold layer 204(2) is then grinded down to the die interconnects 214(4)-214(6) to expose the die interconnects 214(1)-214(3) from a top surface 223 of the second mold layer 204(2).

Then, as shown in exemplary fabrication stage 700D in FIG. 7D, a next step in the fabrication process 700 to fabricate the second die package 206(2) is to form and couple the second isolation layer 228(2) of the second mold layer 204(2) (block 608 in FIG. 6B). The second isolation layer 228(2) is then formed on the top surface 223 of the second mold layer 204(2). In this regard, a top surface 232 of the second isolation layer 228(2) is coupled to the top surface 223 of the second mold layer 204(2) and adjacent to the active faces 218(4)-218(6) of the respective dies 202(4)-202(6). The interconnects 222(4)-222(6) are formed in the second isolation layer 228(2). For example, the interconnects 222(4)-222(6) may be formed as RDLs in the second isolation layer 228(2) using a lithography process. Note as shown in this example in FIG. 7D, interconnect 222(5) also couples dies 202(5) and 202(6). The interconnects 222(4)-222(6) are exposed through a processing step, such as a chemical mechanical planarization (CMP) process, on the bottom surface 224 of the second isolation layer 228(2) to prepare the interconnects 222(4)-222(6) to be coupled to the first reconstituted wafer 702, discussed below, to form antenna modules 200.

Figure 7E:
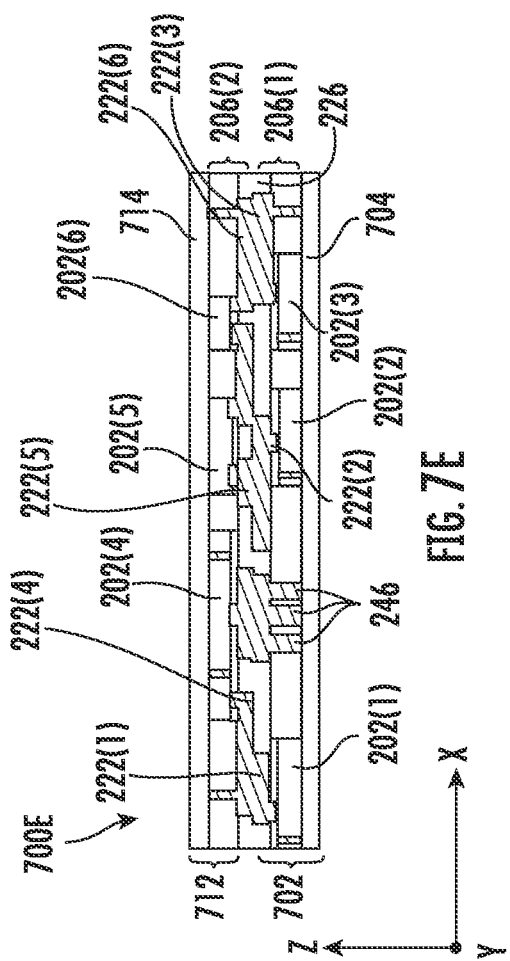
Figure 7F:
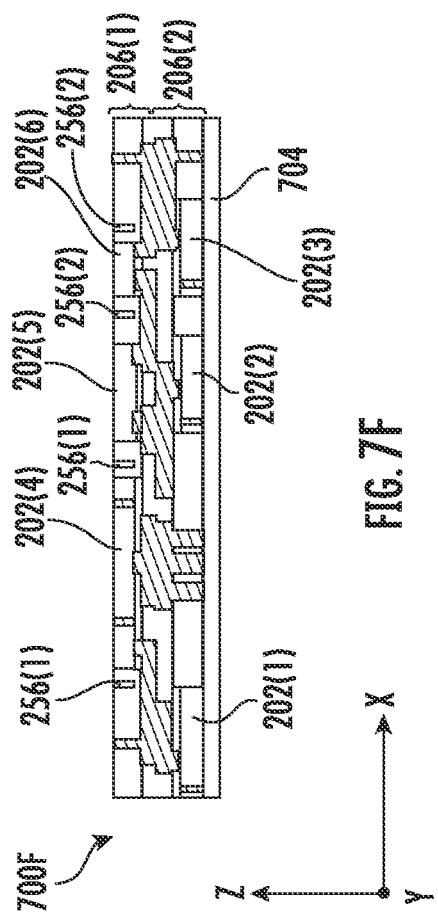
Figure 6C:
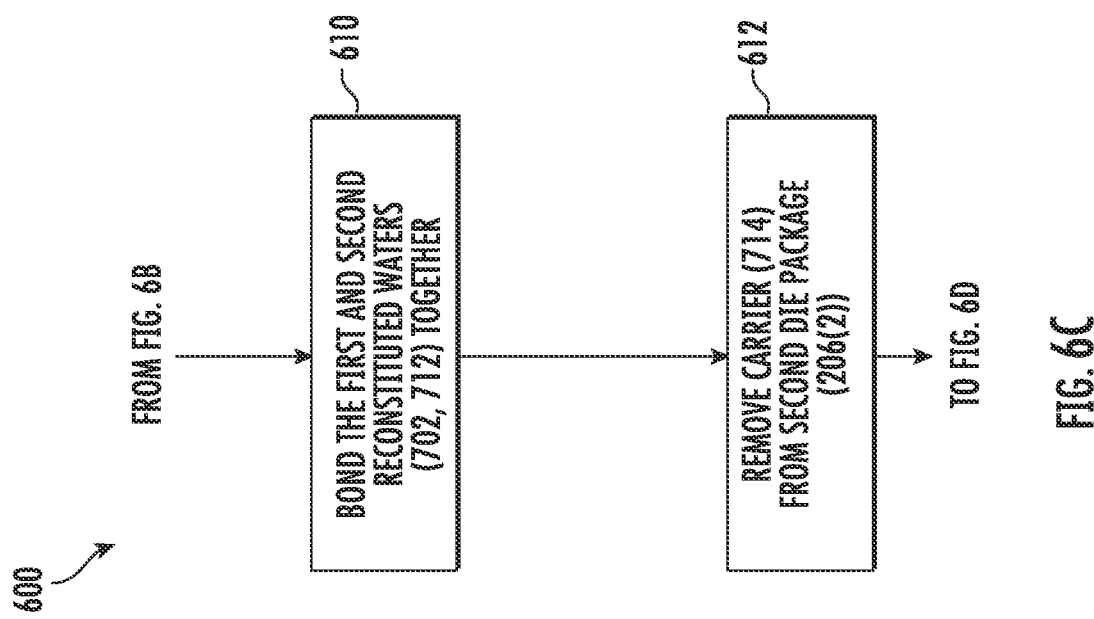

Then, as shown in exemplary fabrication stage 700E in FIG. 7E, a next step in the fabrication process 600 is to bond the first and second reconstituted wafers 702, 712 together (block 610 in FIG. 6C). The second die package 206(2) in FIG. 7D is flipped and bonded to the first die package 206(1) such that the bottom surface 224 of the second isolation layer 228(2) of the second die package 206(2) is coupled to the top surface 220 of the first isolation layer 228(1). As previously discussed, the bottom surface 224 of the second isolation layer 228(2) of the second die package 206(2) can be coupled to the top surface 220 of the first isolation layer 228(1) through compression to form a compression bond 226. Alternatively, an adhesive can be disposed between the bottom surface 224 of the second isolation layer 228(2) and the top surface 220 of the first isolation layer 228(1) to couple the first and second die packages 206(1), 206(2) together. As a result of the bonding, the interconnects 222(1)-222(3) in the first isolation layer 228(1) of the first die package 206(1) are coupled and bonded to the interconnects 222(4)-222(6) of the second isolation layer 228(2) of the second die package 206(2). As previously discussed, the active faces 218(1)-218(3) of dies 202(1)-202(3) face the active faces of die 202(4)-204(6). Next, as shown in exemplary fabrication stage 700F in FIG. 7F, the carrier 714 is removed from the second die package 206(2) to prepare for the antenna 210 to be formed on the second die package 206(2) (block 612 in FIG. 6C). The first and second metal shields 256(1), 256(2) are then formed in the second mold layer 204(1) around the dies 202(4), 204(6) to provide EMI shielding of the dies 202(4), 202(6).

Then, as shown in exemplary fabrication stage 700G in FIG. 7G, a next step in the fabrication process 600 is to build the third isolation layer 234 to form the antenna 210 on the second die package 206(2) (block 614 in FIG. 6D). In this regard, as previously discussed, the third isolation layer 234 is formed on the second mold layer 204(2) of the second die package 206(2) in a vertical direction (Z-axis direction). The isolation layer 234 includes the top surface 236 that antenna elements 212(1)-212(4) are disposed on. The third isolation layer 234 also includes a bottom surface 238 that is adjacent to the second mold layer 204(2) and the respective dies 202(4)-202(6). The third isolation layer 234 includes interconnects 242(1)-242(3) that are coupled to respective dies 202(4), 202(6) through the interconnects 222(4)-222(6). This provides antenna connections between the dies 202(4), 202(6) and the antenna elements 212(1), 212(4) of the antenna 210. The carrier 704 attached to the first die package 206(1) is also removed. The reconstituted wafers 702, 712 in which the different build-up on mold die packages 206(1), 206(2) are formed that are coupled to each other can then be diced to form multiple antenna modules 200.

Then, as shown in exemplary fabrication stage 700H in FIG. 7H, a next step in the fabrication process 600 is to form the heat sink 252 as a conductive structure disposed adjacent to the bottom surface 254 of the first mold layer 204(1) and coupled to the thermal vias 246 to conduct dissipated heat.

An antenna module that includes a 3D build-up on a mold package that includes a first and second mold layers encapsulating respective dies with their active faces facing each other with the first and second mold layers coupled to each other in a vertical direction in a 3D stacked arrangement, to provide a reduced distance between the active faces of the first and second dies, including, but not limited to, the antenna module 200 in FIGS. 2A and 2B, may be provided in or integrated into any wireless communication device and/or processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SiP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 8:
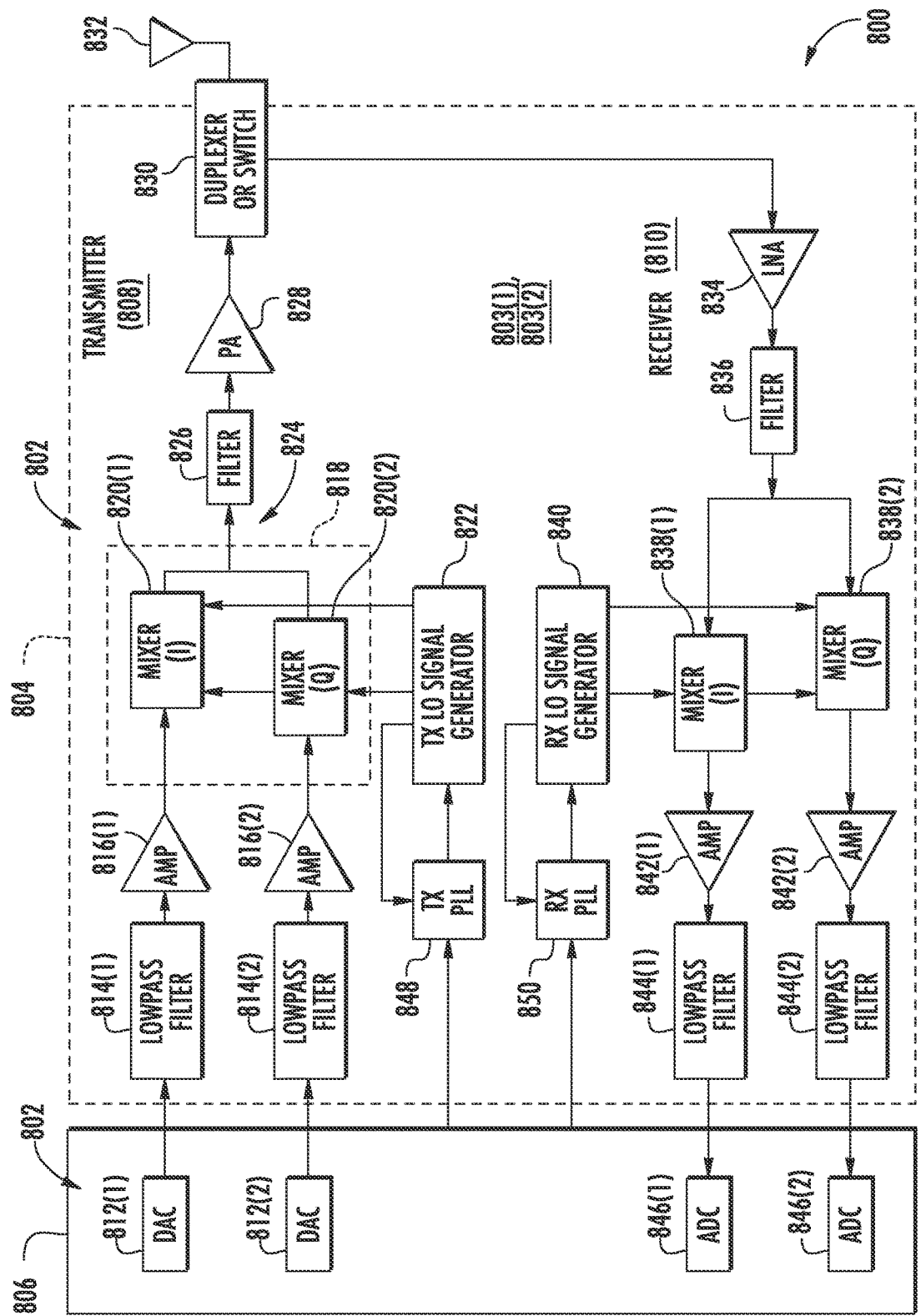
FIG. 8 is a block diagram of an exemplary wireless communications device that includes an antenna module that includes a 3D build-up on mold package that includes a first and second mold layers encapsulating respective dies with their active faces facing each other with the first and second mold layers coupled to each other in a vertical direction in a 3D stacked arrangement, to provide a reduced distance between the active faces of the first and second dies, including, but not limited to, the antenna module in FIGS. 2A and 2B, and according to any of the fabrication processes in FIGS. 5-7H.

FIG. 8 illustrates an exemplary wireless communications device 800 that includes an antenna module 802. The antenna module 802 includes a 3D build-up on mold package that includes a first and second mold layers encapsulating respective dies with their active faces facing each other with the first and second mold layers coupled to each other in a vertical direction in a 3D stacked arrangement, to provide a reduced distance between the active faces of the first and second dies. The antenna module 802 can include the antenna module 200 in FIGS. 2A and 2B, and be fabricated according to any of the fabrication processes in FIGS. 5-7H, as non-limiting examples. As shown in FIG. 8, the wireless communications device 800 includes a RF transceiver 804 and a data processor 806. The components of the RF transceiver and/or data processor 806 can be split among multiple different die packages 803(1), 803(2) that are build-up on mold packages, like shown in the antenna module 200 in FIGS. 2A and 2B. The data processor 806 may include a memory to store data and program codes. The RF transceiver 804 includes a transmitter 808 and a receiver 810 that support bi-directional communications. In general, the wireless communications device 800 may include any number of transmitters 808 and/or receivers 810 for any number of communication systems and frequency bands. All or a portion of the RF transceiver 804 may be implemented on one or more analog ICs, RFICs, mixed-signal ICs, etc.

The transmitter 808 or the receiver 810 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 810. In the direct-conversion architecture, a signal is frequency-converted between RF and baseband in one stage. The super-heterodyne and direct-conversion architectures may use different circuit blocks and/or have different requirements. In the wireless communications device 800 in FIG. 8, the transmitter 808 and the receiver 810 are implemented with the direct-conversion architecture.

In the transmit path, the data processor 806 processes data to be transmitted and provides I and Q analog output signals to the transmitter 808. In the exemplary wireless communications device 800, the data processor 806 includes digital-to-analog converters (DACs) 812(1), 812(2) for converting digital signals generated by the data processor 806 into the I and Q analog output signals, e.g., I and Q output currents, for further processing.

Within the transmitter 808, lowpass filters 814(1), 814(2) filter the I and Q analog output signals, respectively, to remove undesired signals caused by the prior digital-to-analog conversion. Amplifiers (AMPs) 816(1), 816(2) amplify the signals from the lowpass filters 814(1), 814(2), respectively, and provide I and Q baseband signals. An upconverter 818 upconverts the I and Q baseband signals with I and Q transmit (TX) local oscillator (LO) signals through mixers 820(1), 820(2) from a TX LO signal generator 822 to provide an upconverted signal 824. A filter 826 filters the upconverted signal 824 to remove undesired signals caused by the frequency upconversion as well as noise in a receive frequency band. A power amplifier (PA) 828 amplifies the upconverted signal 824 from the filter 826 to obtain the desired output power level and provides a transmit RF signal. The transmit RF signal is routed through a duplexer or switch 830 and transmitted via an antenna 832.

In the receive path, the antenna 832 receives signals transmitted by base stations and provides a received RF signal, which is routed through the duplexer or switch 830 and provided to a low noise amplifier (LNA) 834. The duplexer or switch 830 is designed to operate with a specific receive (RX)-to-TX duplexer frequency separation, such that RX signals are isolated from TX signals. The received RF signal is amplified by the LNA 834 and filtered by a filter 836 to obtain a desired RF input signal. Downconversion mixers 838(1), 838(2) mix the output of the filter 836 with I and Q RX LO signals (i.e., LO_I and LO_Q) from an RX LO signal generator 840 to generate I and Q baseband signals. The I and Q baseband signals are amplified by AMPs 842(1), 842(2) and further filtered by lowpass filters 844(1), 844(2) to obtain I and Q analog input signals, which are provided to the data processor 806. In this example, the data processor 806 includes analog-to-digital converters (ADCs) 846(1), 846(2) for converting the analog input signals into digital signals to be further processed by the data processor 806.

In the wireless communications device 800 of FIG. 8, the TX LO signal generator 822 generates the I and Q TX LO signals used for frequency upconversion, while the RX LO signal generator 840 generates the I and Q RX LO signals used for frequency downconversion. Each LO signal is a periodic signal with a particular fundamental frequency. A TX phase-locked loop (PLL) circuit 848 receives timing information from the data processor 806 and generates a control signal used to adjust the frequency and/or phase of the TX LO signals from the TX LO signal generator 822. Similarly, an RX PLL circuit 850 receives timing information from the data processor 806 and generates a control signal used to adjust the frequency and/or phase of the RX LO signals from the RX LO signal generator 840.

Figure 9:
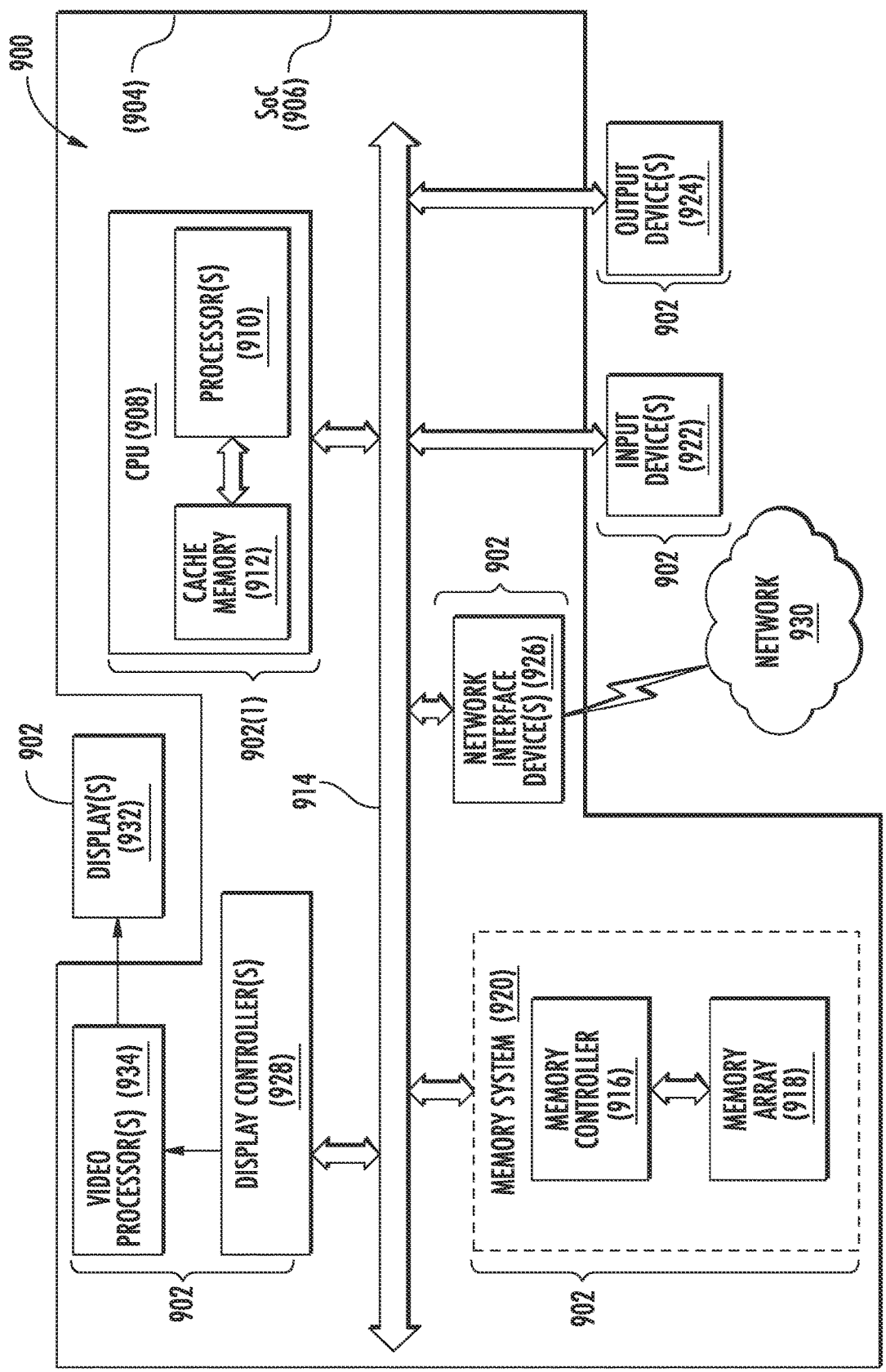
FIG. 9 is a block diagram of an exemplary processor-based system that includes an antenna module that includes a 3D build-up on mold package that includes a first and second mold layers encapsulating respective dies with their active faces facing each other with the first and second mold layers coupled to each other in a vertical direction in a 3D stacked arrangement, to provide a reduced distance between the active faces of the first and second dies, including, but not limited to, the antenna module in FIGS. 2A and 2B, and according to any of the fabrication processes in FIGS. 5-7H.

FIG. 9 illustrates an example of a processor-based system 900 that can include components, any of which can include an antenna module 902 includes a 3D build-up on mold package. The antenna module 902 that includes a first and second mold layers encapsulating respective dies with their active faces facing each other with the first and second mold layers coupled to each other in a vertical direction in a 3D stacked arrangement, to provide a reduced distance between the active faces of the first and second dies. The antenna module 902 can include the antenna module 200 in FIGS. 2A and 2B, and be fabricated according to any of the fabrication processes in FIGS. 5-7H, as non-limiting examples.

In this example, the processor-based system 900 may be formed as a system-on-a-chip (SoC) 906 that includes the multi-directional antenna module 904. The processor-based system 900 includes a CPU 908 that includes one or more processors 910, which may also be referred to as CPU cores or processor cores. The CPU 908 may have cache memory 912 coupled to the CPU 908 for rapid access to temporarily stored data. The CPU 908 is coupled to a system bus 914 and can intercouple master and slave devices included in the processor-based system 900. As is well known, the CPU 908 communicates with these other devices by exchanging address, control, and data information over the system bus 914. For example, the CPU 908 can communicate bus transaction requests to a memory controller 916 as an example of a slave device. Although not illustrated in FIG. 9, multiple system buses 914 could be provided, wherein each system bus 914 constitutes a different fabric.

Other master and slave devices can be connected to the system bus 914. As illustrated in FIG. 9, these devices can include a memory system 920 that includes the memory controller 916 and a memory array(s) 918, one or more input devices 922, one or more output devices 924, one or more network interface devices 926, and one or more display controllers 928, as examples. Each of the memory systems 920, the one or more input devices 922, the one or more output devices 924, the one or more network interface devices 926, and the one or more display controllers 928 can be provided in the same or different IC packages. The input device(s) 922 can include any type of input device, including, but not limited to, input keys, switches, voice processors, etc. The output device(s) 924 can include any type of output device, including, but not limited to, audio, video, other visual indicators, etc. The network interface device(s) 926 can be any device configured to allow exchange of data to and from a network 930. The network 930 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 926 can be configured to support any type of communications protocol desired.

The CPU 908 may also be configured to access the display controller(s) 928 over the system bus 914 to control information sent to one or more displays 932. The display controller(s) 928 sends information to the display(s) 932 to be displayed via one or more video processors 934, which processes the information to be displayed into a format suitable for the display(s) 932. The display controller(s) 928 and video processor(s) 934 can be included the same or different IC packages, and in the same or different IC packages containing the CPU 908 as an example. The display(s) 932 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. An antenna module, comprising:
    a first die package, comprising:
        a first mold layer encapsulating a first die having a first active face; and
        a first isolation layer adjacent to the first mold layer and the first active face of the first die, the first isolation layer comprising a first interconnect coupled to the first active face of the first die and exposed through a first surface of the first isolation layer; and
    a second die package, comprising:
        a second mold layer encapsulating a second die having a second active face; and
        a second isolation layer adjacent to the second mold layer and the second active face of the second die, the second isolation layer comprising a second interconnect coupled to the second active face of the second die and exposed through a second surface of the second isolation layer;
    the second surface of the second isolation layer coupled to the first surface of the first isolation layer to couple the first interconnect to the second interconnect.
2. The antenna module of clause 1, wherein:
    the first isolation layer is disposed in a first plane in a horizontal direction;
    the second isolation layer is disposed in a second plane parallel to the first plane in the horizontal direction; and
    the second surface of the second isolation layer is coupled to the first surface of the first isolation layer in a vertical direction orthogonal to the horizontal direction.
3. The antenna module of clause 1 or 2, wherein:
    the first interconnect of the first isolation layer comprises at least one first redistribution layer (RDL); and
    the second interconnect of the second isolation layer comprises at least one second RDL.
4. The antenna module of any of clauses 1 to 3, wherein the second surface of the second isolation layer is directly bonded to the first surface of the first isolation layer.
5. The antenna module of any of clauses 1 to 4, further comprising a compression bond coupling the second surface of the second isolation layer to the first surface of the first isolation layer.
6. The antenna module of any of clauses 1 to 5, further comprising:
    a third isolation layer comprising a third surface and a fourth surface adjacent to the second mold layer, the third isolation layer comprising a third interconnect coupled to the second die; and
    an antenna comprising at least one antenna element adjacent to the third surface and coupled to the third interconnect.
7. The antenna module of clause 6, wherein the second die comprises a through-vertical interconnect access (via);
    the through-via coupled to the third interconnect to couple the second die to the at least one antenna element.
8. The antenna module of any of clauses 1 to 7, wherein the second mold layer is disposed in a first plane in a horizontal direction; and
    further comprising a metal shield disposed in the second mold layer, the metal shield at least partially surrounding the second die in the first plane.
9. The antenna module of clause 8, wherein the metal shield fully surrounds the second die in the first plane.
10. The antenna module of clause 8, wherein the metal shield comprises:
    a trench disposed in the second mold layer at least partially surrounding the second die; and
    a conductive material disposed in the trench.
11. The antenna module of any of clauses 1 to 10, further comprising a vertical interconnect access (via) disposed in the first mold layer and coupled to the first interconnect.
12. The antenna module of clause 11, wherein the via comprises a through-mold via (TMV) extending through the first mold layer and coupled to the first interconnect.
13. The antenna module of clause 11 or 12, wherein the via is configured to dissipate heat generated by the second die.
14. The antenna module of any of clauses 1 to 13, wherein the second die comprises a power amplifier.
15. The antenna module of any of clauses 1 to 14 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SiP) phone; a tablet; a phablet; a server; a computer, a portable computer, a mobile computing device; a wearable computing device; a desktop computer; a personal digital assistant (PDA); a monitor; a computer monitor, a television; a tuner, a radio; a satellite radio; a music player; a digital music player; a portable music player, a digital video player; a video player; a digital video disc (DVD) player, a portable digital video player; an automobile; a vehicle component; avionics systems; a drone; and a multicopter.
16. A method of fabricating an antenna module, comprising:
    forming a first die package, comprising:
        forming a first mold layer encapsulating a first die having a first active face; and
        forming a first isolation layer adjacent to the first mold layer and the first active face of the first die, the first isolation layer comprising a first interconnect coupled to the first active face of the first die and exposed through a first surface of the first isolation layer,
    forming a second die package, comprising:
        forming a second mold layer encapsulating a second die having a second active face; and
        forming a second isolation layer adjacent to the second mold layer and the second active face of the second die, the second isolation layer comprising a second interconnect coupled to the second active face of the second die and exposed through a second surface of the second isolation layer; and
coupling the second surface of the second isolation layer to the first surface of the first isolation layer to couple the first interconnect to the second interconnect.

17. The method of clause 16, wherein coupling the second surface of the second isolation layer to the first surface of the first isolation layer comprises bonding the second surface of the second isolation layer to the first surface of the first isolation layer.

18. The method of clause 17, wherein bonding the second surface of the second isolation layer to the first surface of the first isolation layer comprises compression bonding the second surface of the second isolation layer to the first surface of the first isolation layer.

19. The method of any of clauses 16 to 18, further comprising:
   forming a third isolation layer comprising a third surface and a fourth surface adjacent to the second mold layer;
   coupling a third interconnect disposed in the third isolation layer to the second die;
   disposing at least one antenna element adjacent to the third surface; and
   coupling the third interconnect to the at least one antenna element.

20. The method of clause 19, wherein the second die comprises a through-vertical interconnect access (via); and
   further comprising coupling the through-via to the third interconnect to couple the second die to the at least one antenna element.

21. The method of any of clauses 16 to 20, wherein forming the second mold layer comprises disposing the second mold layer in a first plane in a horizontal direction; and
   further comprising forming a metal shield in the second mold layer that at least partially surrounds the second die in the first plane.

22. The method of clause 21, wherein forming the metal shield comprises:
   forming a trench in the second mold layer at least partially surrounding the second die; and
   disposing a conductive material in the trench.

23. The method of any of clauses 16 to 22, further comprising:
   forming a vertical interconnect access (via) in the first mold layer, and
   coupling the via to the first interconnect.

What is claimed is:

1. An antenna module, comprising:
   a first die package, comprising:
      a first mold layer encapsulating a first die having a first active face; and
      a first isolation layer adjacent to the first mold layer and the first active face of the first die, the first isolation layer comprising a first interconnect coupled to the first active face of the first die and exposed through a first surface of the first isolation layer; and
   a second die package, comprising:
      a second mold layer encapsulating a second die having a second active face, wherein the second mold layer is disposed in a first plane in a horizontal direction;
      a metal shield disposed in the second mold layer, the metal shield at least partially surrounding the second die in the first plane; and
      a second isolation layer adjacent to the second mold layer and the second active face of the second die, the second isolation layer comprising a second interconnect coupled to the second active face of the second die and exposed through a second surface of the second isolation layer;
      the second surface of the second isolation layer coupled to the first surface of the first isolation layer to couple the first interconnect to the second interconnect.

2. The antenna module of claim 1, wherein:
   the first isolation layer is disposed in a first plane in a horizontal direction;
   the second isolation layer is disposed in a second plane parallel to the first plane in the horizontal direction; and
   the second surface of the second isolation layer is coupled to the first surface of the first isolation layer in a vertical direction orthogonal to the horizontal direction.

3. The antenna module of claim 1, wherein:
   the first interconnect of the first isolation layer comprises at least one first redistribution layer (RDL); and
   the second interconnect of the second isolation layer comprises at least one second RDL.

4. The antenna module of claim 1, wherein the second surface of the second isolation layer is directly bonded to the first surface of the first isolation layer.

5. The antenna module of claim 1, further comprising a compression bond coupling the second surface of the second isolation layer to the first surface of the first isolation layer.

6. The antenna module of claim 1, further comprising:
   a third isolation layer comprising a third surface and a fourth surface adjacent to the second mold layer, the third isolation layer comprising a third interconnect coupled to the second die; and
   an antenna comprising at least one antenna element adjacent to the third surface and coupled to the third interconnect.

7. The antenna module of claim 6, wherein the second die comprises a through-vertical interconnect access (via);
   the through-via coupled to the third interconnect to couple the second die to the at least one antenna element.

8. The antenna module of claim 1, wherein the metal shield fully surrounds the second die in the first plane.

9. The antenna module of claim 1, wherein the metal shield comprises:
   a trench disposed in the second mold layer at least partially surrounding the second die; and
   a conductive material disposed in the trench.

10. The antenna module of claim 1, further comprising a vertical interconnect access (via) disposed in the first mold layer and coupled to the first interconnect.

11. The antenna module of claim 10, wherein the via comprises a through-mold via (TMV) extending through the first mold layer and coupled to the first interconnect.

12. The antenna module of claim 10, wherein the via is configured to dissipate heat generated by the second die.

13. The antenna module of claim 12, further comprising a third isolation layer, a heat sink, and an antenna, wherein the first isolation layer is formed on a top surface of the first mold layer, wherein the heatsink is coupled to the via and is adjacent a bottom surface of the first mold layer, wherein the second isolation layer is formed on a third surface of the second mold layer, wherein a bottom surface of the third isolation layer is adjacent to a fourth surface of the second mold layer, the fourth surface being opposite the third surface, and wherein the antenna is disposed on a top surface of the third isolation layer.

14. The antenna module of claim 1, wherein the second die comprises a power amplifier.

15. The antenna module of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SiP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

16. A method of fabricating an antenna module, comprising:
    forming a first die package, comprising:
        forming a first mold layer encapsulating a first die having a first active face; and
        forming a first isolation layer adjacent to the first mold layer and the first active face of the first die, the first isolation layer comprising a first interconnect coupled to the first active face of the first die and exposed through a first surface of the first isolation layer;
    forming a second die package, comprising:
        forming a second mold layer encapsulating a second die having a second active face, wherein forming the second mold layer comprises disposing the second mold layer in a first plane in a horizontal direction; and
        forming a second isolation layer adjacent to the second mold layer and the second active face of the second die, the second isolation layer comprising a second interconnect coupled to the second active face of the second die and exposed through a second surface of the second isolation layer;
    forming a metal shield in the second mold layer that at least partially surrounds the second die in the first plane; and
    coupling the second surface of the second isolation layer to the first surface of the first isolation layer to couple the first interconnect to the second interconnect.

17. The method of claim 16, wherein coupling the second surface of the second isolation layer to the first surface of the first isolation layer comprises bonding the second surface of the second isolation layer to the first surface of the first isolation layer.

18. The method of claim 17, wherein bonding the second surface of the second isolation layer to the first surface of the first isolation layer comprises compression bonding the second surface of the second isolation layer to the first surface of the first isolation layer.

19. The method of claim 16, further comprising:
    forming a third isolation layer comprising a third surface and a fourth surface adjacent to the second mold layer;
    coupling a third interconnect disposed in the third isolation layer to the second die;
    disposing at least one antenna element adjacent to the third surface; and
    coupling the third interconnect to the at least one antenna element.

20. The method of claim 19, wherein the second die comprises a through-vertical interconnect access (via); and
    further comprising coupling the through-via to the third interconnect to couple the second die to the at least one antenna element.

21. The method of claim 16, wherein forming the metal shield comprises:
    forming a trench in the second mold layer at least partially surrounding the second die; and
    disposing a conductive material in the trench.

22. The method of claim 16, further comprising:
    forming a vertical interconnect access (via) in the first mold layer; and
    coupling the via to the first interconnect.

23. The method of claim 22, wherein the first isolation layer is formed on a top surface of the first mold layer, wherein the second isolation layer is formed on a third surface of the second mold layer, wherein a bottom surface of a third isolation layer is adjacent to a fourth surface of the second mold layer, the fourth surface being opposite the third surface, and wherein the method further comprises disposing an antenna on a top surface of the third isolation layer and forming a heatsink coupled to the via and adjacent a bottom surface of the first mold layer.

* * * * *